(12) United States Patent
Hata

(10) Patent No.: US 9,236,869 B2
(45) Date of Patent: Jan. 12, 2016

(54) SEMICONDUCTOR DEVICE

(71) Applicant: Renesas Electronics Corporation, Kawasaki-shi (JP)

(72) Inventor: Katsuhiko Hata, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/606,743

(22) Filed: Jan. 27, 2015

(65) Prior Publication Data

US 2015/0229314 A1 Aug. 13, 2015

(30) Foreign Application Priority Data

Feb. 7, 2014 (JP) .................................. 2014-022501

(51) Int. Cl.
*H03L 7/06* (2006.01)
*H03L 7/08* (2006.01)
*H03K 3/012* (2006.01)

(52) U.S. Cl.
CPC .............. *H03L 7/0802* (2013.01); *H03K 3/012* (2013.01)

(58) Field of Classification Search
USPC ................................. 327/147–149, 156–158
See application file for complete search history.

(56) References Cited

U.S. PATENT DOCUMENTS

| 8,860,467 | B2* | 10/2014 | Malipatil et al. | 327/3 |
| 2012/0081158 | A1* | 4/2012 | Mateman et al. | 327/156 |
| 2012/0200328 | A1* | 8/2012 | Yao | 327/157 |
| 2013/0009679 | A1* | 1/2013 | Sindalovsky et al. | 327/147 |

FOREIGN PATENT DOCUMENTS

JP 2011-244284 A 12/2011

OTHER PUBLICATIONS

Brian S. Leibowitz et al., "A 7.5Gb/s 10-Tap DFE Receiver with First Tap Partial Response, Spectrally Gated Adaptation, and 2nd-Order Data-Filtered CDR", ISSCC 2007.

* cited by examiner

*Primary Examiner* — Adam Houston
(74) *Attorney, Agent, or Firm* — McGinn IP Law Group, PLLC

(57) ABSTRACT

In order to solve a problem that power consumption as to an edge sampling circuit is large in a semiconductor device in the related art, a semiconductor device according to one embodiment has a first sampling circuit for outputting an odd-numbered data value and an edge value and a second sampling circuit for outputting an even-numbered data value and an edge value, and a first offset and a second offset used for determining the edge value in one sampling circuit are determined based on a data value acquired from a location other than between a selector for selecting one of a plurality of data values sampled with a different offset in a path for sampling the data value and a shift register for transferring the data value selected by the selector in the other sampling circuit.

9 Claims, 22 Drawing Sheets

PHASE ADVANCE

PHASE DELAY

| x(n-3) | x(n-2) | OFFSET VALUE USED FOR SAMPLING ea(n) (FIRST OFFSET) | OFFSET VALUE USED FOR SAMPLING eb(n) (SECOND OFFSET) |
|---|---|---|---|
| 0 | 0 | -w1 | +w1 |
| 1 | 0 | 0 | -w1 |
| 0 | 1 | 0 | +w1 |
| 1 | 1 | +w1 | -w1 |

FIG. 18

| CASE No. | x(n-3) | x(n-2) | x(n-1) | x(n) | x(n+1) | FIRST OFFSET (ea(n)) | SECOND OFFSET (eb(n)) | EXPECTED OFFSET VALUE | EDGE VALUE TO BE SELECTED AS e(n) |
|---|---|---|---|---|---|---|---|---|---|
| 1 | 0 | 0 | 0 | 0 | 1 | -w1 | +w1 | -w1 | ea(n) |
| 2 | 1 | 0 | 0 | 0 | 1 | 0 | -w1 | -w1 | eb(n) |
| 3 | 0 | 1 | 0 | 0 | 1 | 0 | +w1 | -w1 | - |
| 4 | 1 | 1 | 0 | 0 | 1 | +w1 | -w1 | -w1 | eb(n) |
| 5 | 0 | 0 | 1 | 0 | 1 | -w1 | +w1 | 0 | - |
| 6 | 1 | 0 | 1 | 0 | 1 | 0 | -w1 | 0 | ea(n) |
| 7 | 0 | 1 | 1 | 0 | 1 | 0 | +w1 | 0 | ea(n) |
| 8 | 1 | 1 | 1 | 0 | 1 | +w1 | -w1 | 0 | - |
| 9 | 0 | 0 | 0 | 1 | 0 | -w1 | +w1 | 0 | - |
| 10 | 1 | 0 | 0 | 1 | 0 | 0 | -w1 | 0 | ea(n) |
| 11 | 0 | 1 | 0 | 1 | 0 | 0 | +w1 | 0 | ea(n) |
| 12 | 1 | 1 | 0 | 1 | 0 | +w1 | -w1 | 0 | - |
| 13 | 0 | 0 | 1 | 1 | 0 | -w1 | +w1 | +w1 | eb(n) |
| 14 | 1 | 0 | 1 | 1 | 0 | 0 | -w1 | +w1 | - |
| 15 | 0 | 1 | 1 | 1 | 0 | 0 | +w1 | +w1 | eb(n) |
| 16 | 1 | 1 | 1 | 1 | 0 | +w1 | -w1 | +w1 | ea(n) |

FIG. 19

| x(n-3) | x(n-2) | x(n-1) | x(n) | x(n+1) |
|--------|--------|--------|------|--------|
| X | 0 | 0 | 0 | 1 |
| 1 | 1 | 0 | 0 | 1 |
| 1 | 0 | 1 | 0 | 1 |
| 0 | 1 | 1 | 0 | 1 |
| 1 | 0 | 0 | 1 | 0 |
| 0 | 1 | 0 | 1 | 0 |
| 0 | 0 | 1 | 1 | 0 |
| X | 1 | 1 | 1 | 0 |

FIG. 20

| $x(n-3) : x(n+1)$ | $x(n-7) : x(n+1)$ | DATA STRING CLOSEST TO e(n) AMONG DATA STRINGS THAT ENABLE ACQUISITION OF VALID EDGE VALUE | VALID EDGE VALUE CLOSEST TO e(n) |
|---|---|---|---|
| 01001 (CASE 3) | XX0001001 | $x(n-6) : x(n-2)$ | $e(n-3)$ |
| | XX0101001 | $x(n-5) : x(n-1)$ | $e(n-2)$ |
| | XX1001001 | $x(n-5) : x(n-1)$ | $e(n-2)$ |
| | X01101001 | $x(n-6) : x(n-2)$ | $e(n-3)$ |
| | X11101001 | $x(n-7) : x(n-3)$ | $e(n-4)$ |
| 00101 (CASE 5) | XXX000101 | $x(n-5) : x(n-1)$ | $e(n-2)$ |
| | XXX100101 | $x(n-4) : x(n)$ | $e(n-1)$ |
| 11101 (CASE 8) | XXX11101 | $x(n-4) : x(n)$ | $e(n-1)$ |

CASE 9 IS INVERSION OF CASE 3. CASE 12 IS INVERSION OF CASE 5, AND CASE 14 IS INVERSION OF CASE 3. THEREFORE, CASES 9, 12, 14 CAN BE TREATED IN THE SAME WAY AS CASES 8, 5, 3.

| x(n-3) | x(n-2) | OFFSET VALUE USED FOR SAMPLING ea(n) (FIRST OFFSET) | OFFSET VALUE USED FOR SAMPLING eb(n) (SECOND OFFSET) |
|---|---|---|---|
| 0 | 0 | -w1 | +w1 |
| 1 | 0 | -w1 | 0 |
| 0 | 1 | 0 | +w1 |
| 1 | 1 | -w1 | +w1 |

FIG. 24

| CASE No. | x(n-3) | x(n-2) | x(n-1) | x(n) | x(n+1) | FIRST OFFSET (ea(n)) | SECOND OFFSET (eb(n)) | EXPECTED OFFSET VALUE | EDGE VALUE TO BE SELECTED AS e(n) |
|---|---|---|---|---|---|---|---|---|---|
| 1 | 0 | 0 | 0 | 0 | 1 | -w1 | +w1 | -w1 | ea(n) |
| 2 | 1 | 0 | 0 | 0 | 1 | -w1 | 0 | -w1 | ea(n) |
| 3 | 0 | 1 | 0 | 0 | 1 | 0 | +w1 | -w1 | – |
| 4 | 1 | 1 | 0 | 0 | 1 | -w1 | +w1 | -w1 | ea(n) |
| 5 | 0 | 0 | 1 | 0 | 1 | -w1 | +w1 | 0 | – |
| 6 | 1 | 0 | 1 | 0 | 1 | -w1 | 0 | 0 | eb(n) |
| 7 | 0 | 1 | 1 | 0 | 1 | 0 | +w1 | 0 | ea(n) |
| 8 | 1 | 1 | 1 | 0 | 1 | -w1 | +w1 | 0 | – |
| 9 | 0 | 0 | 0 | 1 | 0 | -w1 | +w1 | 0 | – |
| 10 | 1 | 0 | 0 | 1 | 0 | -w1 | 0 | 0 | eb(n) |
| 11 | 0 | 1 | 0 | 1 | 0 | 0 | +w1 | 0 | ea(n) |
| 12 | 1 | 1 | 0 | 1 | 0 | -w1 | +w1 | 0 | – |
| 13 | 0 | 0 | 1 | 1 | 0 | -w1 | +w1 | +w1 | eb(n) |
| 14 | 1 | 0 | 1 | 1 | 0 | -w1 | 0 | +w1 | – |
| 15 | 0 | 1 | 1 | 1 | 0 | 0 | +w1 | +w1 | eb(n) |
| 16 | 1 | 1 | 1 | 1 | 0 | -w1 | +w1 | +w1 | eb(n) |

SEMICONDUCTOR DEVICE

CROSS-REFERENCE TO RELATED APPLICATIONS

The disclosure of Japanese Patent Application No. 2014-022501 filed on Feb. 7, 2014 including the specification, drawings and abstract is incorporated herein by reference in its entirety.

BACKGROUND

The present invention relates to a semiconductor device, and more particularly, to a semiconductor device that extracts a clock signal and a data signal from a received high-speed serial signal.

In recent years, there has commonly been used serial communication with serial signals between electronic devices or between semiconductor devices. The serial communication is used in SATA (Serial ATA), USB (Universal Serial Bus), a wired LAN (Local Area Network), and the like. In the serial communication, the speed (frequency) of a transmission signal has recently been enhanced significantly, which disadvantageously causes a signal loss in a transmission line. For this reason, a reception circuit for serial communication receives a signal, using a correction circuit such as a decision feedback equalizer (DFE).

In the decision feedback equalizer, the stabilization result of a currently receiving data value needs to be fed the decision feedback equalizer, the time allowed for the process of feeding back the determination result is restricted within 1 UI (Unit Interval). For this reason, the decision feedback equalizer disadvantageously cannot deal with the enhanced speed of the transmission signal. Accordingly, to ease the restriction of the time required for feedback, a loop-unrolling-based decision feedback equalizer is proposed. The loop-unrolling equalizes an input signal speculatively without feeding back the first tap data value. Accordingly, by using the loop-unrolling-based decision feedback equalizer, it is possible to extend the time allowed for feedback to, e.g., 2 UI. Patent Document 1 and Non-patent Document 1 disclose examples of the loop-unrolling-based decision feedback equalizer.

The equalizer disclosed in Patent Document 1 includes first waveform equalization processing means and second waveform equalization processing means which alternately perform waveform equalization processing on a plurality of successively inputted signals. In the equalizer of Patent Document 1, the first waveform equalization processing means and the second waveform equalization processing means each add a value obtained by multiplying a value a indicating the determination result of the second last input signal and a value b indicating the determination result of the fourth last input signal by a constant w2 to the input signal subject to waveform equalization processing, thereby performing the waveform equalization processing. Further, Non-patent Document 1 discloses an example of performing equalization processing based on a value indicating the determination result of the second last or older input signal, as in Patent Document 1.

PATENT DOCUMENT 1

Japanese Unexamined Patent Publication No. 2011-244284

NON-PATENT DOCUMENT 1

Brian S. Leibowitz' et al., A 7.5 Gb/s 10-Tap DFE Receiver with First Tap Partial Response, Spectrally Gated Adaptation, and 2nd-Order Data-Filtered CDR, ISSCC 2007

SUMMARY

However, the use of the equalizer disclosed in Patent Document 1 or Non-patent Document 1 disadvantageously increases power consumption as to an edge sampling circuit for performing edge sampling.

The other problems and novel features will become apparent from the description of this specification and the accompanying drawings.

According to one embodiment, a semiconductor device has a first sampling circuit for outputting an odd-numbered data value and an edge value and a second sampling circuit for outputting an even-numbered data value and an edge value, and a first offset and a second offset used for determining the edge value in one sampling circuit are determined based on a data value acquired from a location other than between a selector for selecting one of a plurality of data values sampled with a different offset in a path for sampling the data value and a shift register for transferring the data value selected by the selector in the other sampling circuit.

Further, the replacement of the device according to the above embodiment with a method or a system, a program for causing a computer to execute processing of the device or part of the device, and the like are embraced as aspects of the invention.

According to the one embodiment, the semiconductor device can reduce the power consumption of a loop-unrolling decision feedback equalizer.

BRIEF DESCRIPTION OF THE DRAWINGS

FIG. 18 is a table showing the relationship between the pattern of data values inputted to the semiconductor device according to the second embodiment and the offsets to the edge sampling circuits.

FIG. 19 is a table showing the patterns of data values that enable the sampling of a valid edge value in the semiconductor device according to the second embodiment.

FIG. 20 is a table for explaining a data string closest to an edge value e(n) among data strings that enable the acquisition of the valid edge value in the semiconductor device according to the second embodiment.

FIG. 24 is a table showing the relationship between the pattern of data values inputted to the semiconductor device according to the third embodiment and the offsets to the edge sampling circuits.

DETAILED DESCRIPTION

To clarify the description, appropriate omission and simplification are made in the following description and drawings. Hereinafter, embodiments will be described with reference to the drawings. First, FIG. 1 is a block diagram of a semiconductor device 1 according to a first embodiment.

Figure 1:
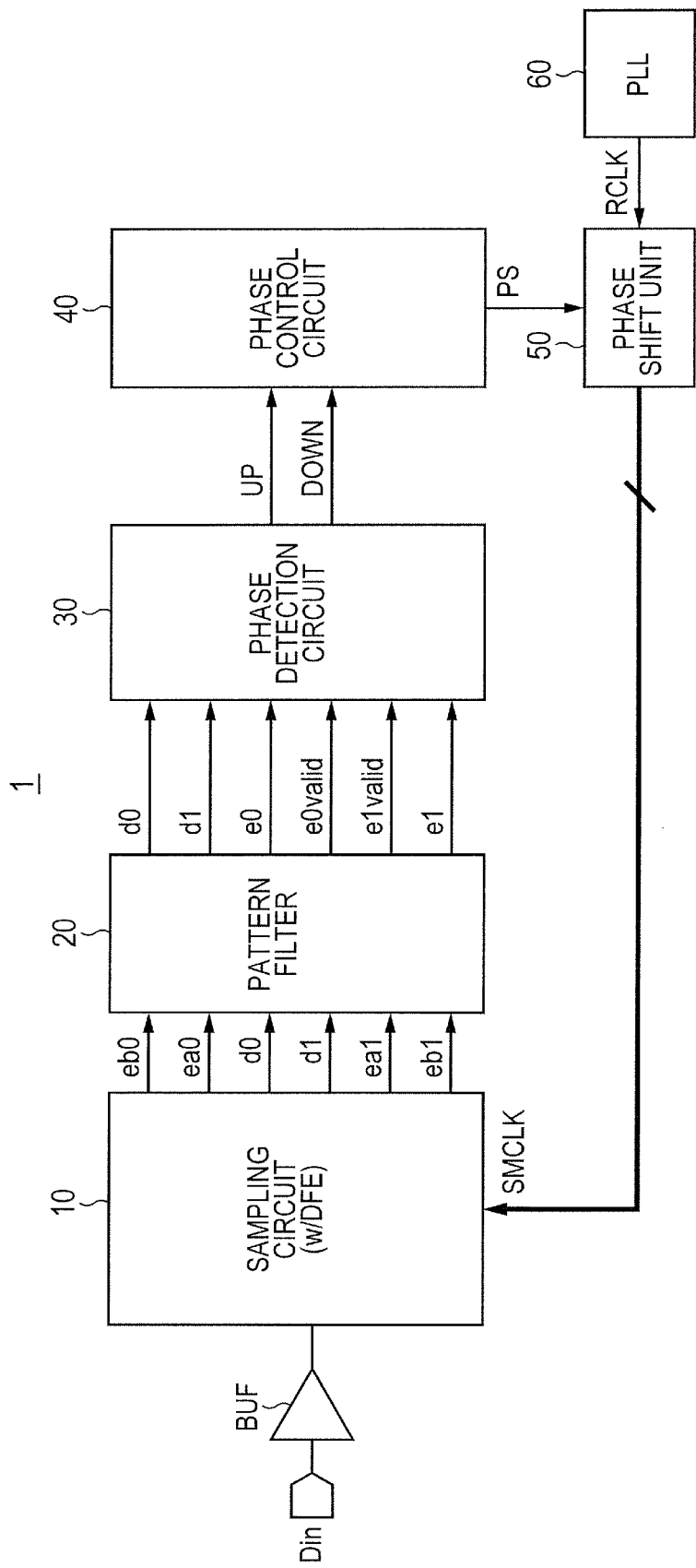
FIG. 1 is a block diagram of a semiconductor device according to a first embodiment.

The semiconductor device 1 according to the first embodiment shown in FIG. 1 receives a serial signal Din and extracts data from the serial signal Din. Further, the semiconductor device 1 according to the first embodiment generates sampling clocks used for sampling a data value, based on the serial signal Din. That is, the semiconductor device 1 according to the first embodiment is used as a CDR (clock and data recovery) circuit. Further, the semiconductor device 1 according to the first embodiment uses, as the sampling clocks, multiphase sampling clocks including a plurality of clocks having a plurality of different phases.

As shown in FIG. 1, the semiconductor device 1 according to the first embodiment has a sampling circuit 10, a pattern filter 20, a phase detection circuit 30, a phase control circuit 40, a phase shift unit 50, and a PLL (Phase Locked Loop) circuit 60. The semiconductor device 1 extracts a data value from the received input signal Din. Further, the semiconductor device 1 extracts an edge value along with the data value, and controls the phase of a clock used for sampling, based on the data value and the edge value.

The sampling circuit 10 extracts data values d0, d1 and edge values ea0, eb0, ea1, eb1 from the input signal Din in accordance with multiphase sampling clock signals CLK outputted from the phase shifter 50. In the semiconductor device 1 according to the first embodiment, four clock signals having different phases by 90 degrees are used as the multiphase sampling clocks. The sampling circuit 10 performs a sampling operation with 2 UI for one sampling clock. That is, the sampling circuit 10 outputs the odd-numbered data value d0 and the even-numbered data value d1 during one cycle of the sampling clock. Further, the sampling circuit 10 outputs the edge values ea0 and eb0 corresponding to the data value d0, and outputs the edge values ea1 and eb1 corresponding to the data value d1. In the description below, 1 UI is occasionally referred to as one sampling period.

The pattern filter 20 determines the validity or invalidity of the edge value, based on a temporal change of the data value. More specifically, based on the logic levels of data values outputted from the sampling circuit in successive sampling periods, the pattern filter 20 selects and outputs one of a first edge value and a second edge value included in the edge value, and outputs a flag value indicating the validity of the selected edge value. In the first embodiment, the pattern filter 20 determines the validity of the edge values ea0, eb0, ea1, eb1, based on the data values d0, d1 outputted from the sampling circuit 10, and outputs valid edge flags e0valid, e1valid and valid edge values e0, e1 along with the data values d0, d1, based on the determination result.

The phase detection circuit 30 determines the phase difference between one of the multiphase sampling clocks SMCLK and the input signal, based on the edge value determined to be valid by the pattern filter 20 and the data value. More specifically, the phase detection circuit 30 determines the advance or delay of a data phase, and outputs an up signal UP and a down signal DOWN, based on the determination result. The up signal UP is outputted if the phase of the multiphase sampling clock is delayed from that of the input signal. The down signal DOWN is outputted if the phase of the multiphase sampling clock is advanced from that of the input signal.

The phase control circuit 40 outputs a phase control signal PS for controlling the phase of the multiphase sampling clock SMCLK, in accordance with the determination result of the phase detection circuit 30. More specifically, the phase control circuit 40 filters phase information indicated by the up signal UP and the down signal DOWN, determines the phase of the multiphase sampling clock, and controls the phase shift unit 50.

The phase shift unit 50 generates multiphase clocks from a reference clock RCLK, and outputs the multiphase sampling clocks SMCLK selected from the multiphase clocks based on the phase control signal PS. The phase shift unit 50 shifts the phases of the multiphase sampling clocks SMCLK by changing and selecting clocks among the multiphase clocks generated from the reference clock outputted from the PLL circuit 60, and outputs the multiphase sampling clocks SMCLK for sampling data and edges. The PLL circuit 60 outputs the reference clock RCLK.

The semiconductor device 1 according to the first embodiment has the sampling circuit 10 as one of the features. Further, the pattern filter 20 according to the first embodiment has a feature for allowing the feature of the sampling circuit 10 to function effectively. Hereinafter, the sampling circuit 10 and the pattern filter 20 will be described in greater detail.

Figure 2:
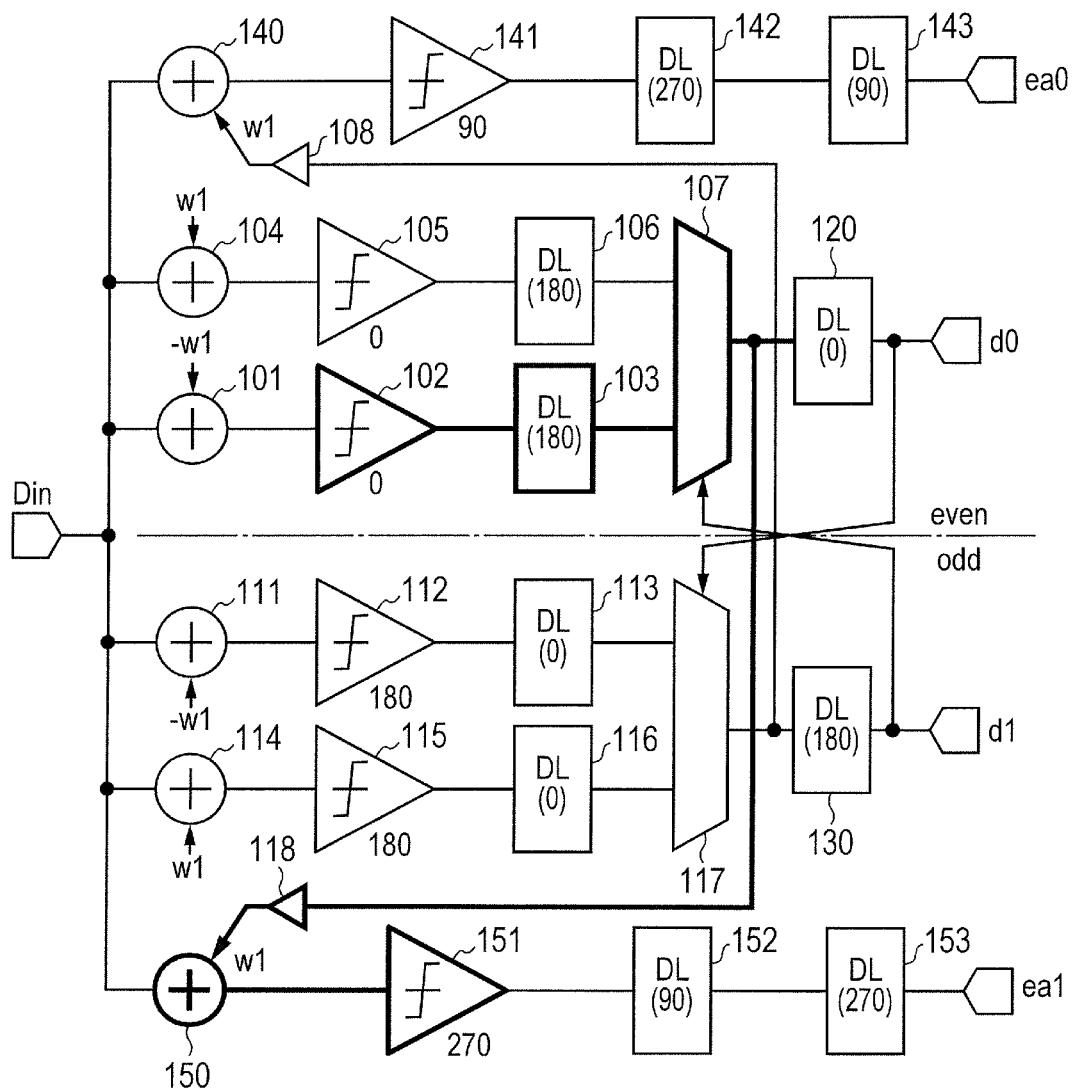
FIG. 2 is a schematic diagram of a sampling circuit for explaining a problem caused in the sampling circuit.

The sampling circuit 10 is comprised of a loop unrolling decision feedback equalizer (hereinafter simply referred to as a decision feedback equalizer). First, a problem caused in the decision feedback equalizer will be described in detail. In the decision feedback equalizer described below, by a half rate system, the data value and the edge value are sampled by the sampling clock of half the frequency of an input signal data rate. FIG. 2 is a circuit diagram of a decision feedback equalizer 10a for explaining the problem with the decision feedback equalizer.

The decision feedback equalizer 10a shown in FIG. 2 has a first sampling circuit for sampling an odd-numbered data value and an edge value corresponding to the data value and a second sampling circuit for sampling an even-numbered data value and an edge value corresponding to the data value.

In the example shown in FIG. 2, the first sampling circuit has mixers 101, 104, 140, data samplers 102, 105, an edge sampler 141, D latch circuits 103, 106, 120, 142, 143, a selector 107, and a buffer circuit 108. The second sampling circuit has mixers 111, 114, 150, data samplers 112, 115, an edge sampler 151, D latch circuits 113, 116, 130, 152, 153, a selector 117, and a buffer circuit 118.

Further, the mixer 101, the data sampler 102, and the D latch circuit 103 configure a first data sampling circuit of the first sampling circuit. The first data sampling circuit adds a negative offset to the signal level of the input signal Din, samples the input signal, and outputs a first data value. The mixer 104, the data sampler 105, and the D latch circuit 106 configure a second data sampling circuit of the first sampling circuit. The second data sampling circuit adds a positive offset to the signal level of the input signal Din, samples the input signal, and outputs a second data value. The mixer 140, the edge sampler 141, and the D latch circuits 142, 143 configure an edge sampling circuit of the first sampling circuit. The edge sampling circuit adds a first offset to the signal level of the input signal Din, and outputs a first edge value indicating the value of an edge part of the input signal Din.

The mixer 111, the data sampler 112, and the D latch circuit 113 configure a first data sampling circuit of the second sampling circuit. The first data sampling circuit adds a negative offset to the signal level of the input signal Din, samples the input signal, and outputs a first data value. The mixer 114, the data sampler 115, and the D latch circuit 116 configure a second data sampling circuit of the second sampling circuit. The second data sampling circuit adds a positive offset to the signal level of the input signal Din, samples the input signal, and outputs a second data value. The mixer 150, the edge sampler 151, and the D latch circuits 152, 153 configure an edge sampling circuit of the second sampling circuit. The edge sampling circuit adds a first offset to the signal level of the input signal Din, and outputs a first edge value indicating the value of an edge part of the input signal Din.

Further, as shown in FIG. 2, in the decision feedback equalizer 10a, the first sampling circuit and the second sampling circuit output the data value by selecting, by the selector, the first data value or the second data value obtained by sampling the input signal with the fixed offset speculatively added, in accordance with a determination result in the previous sampling period. Thus, by the loop-unrolling, the data value is sampled based on the speculative offset.

On the other hand, in the case of sampling the edge value based on the speculatively applied offset in the decision feedback equalizer 10a, there are needed an edge sampling circuit for sampling the edge value based on the positive offset and an edge sampling circuit for sampling the edge value based on the negative offset. The increased number of edge sampling circuits disadvantageously increases a circuit area and power consumption.

In the decision feedback equalizer 10a, the determined data values outputted from the selectors 107, 117 are fed back to the mixers 150, 140 through the buffers 118, 108. This reduces the number of edge sampling circuits in the decision feedback equalizer 10a, thereby reducing the circuit area and the power consumption.

Figure 3:
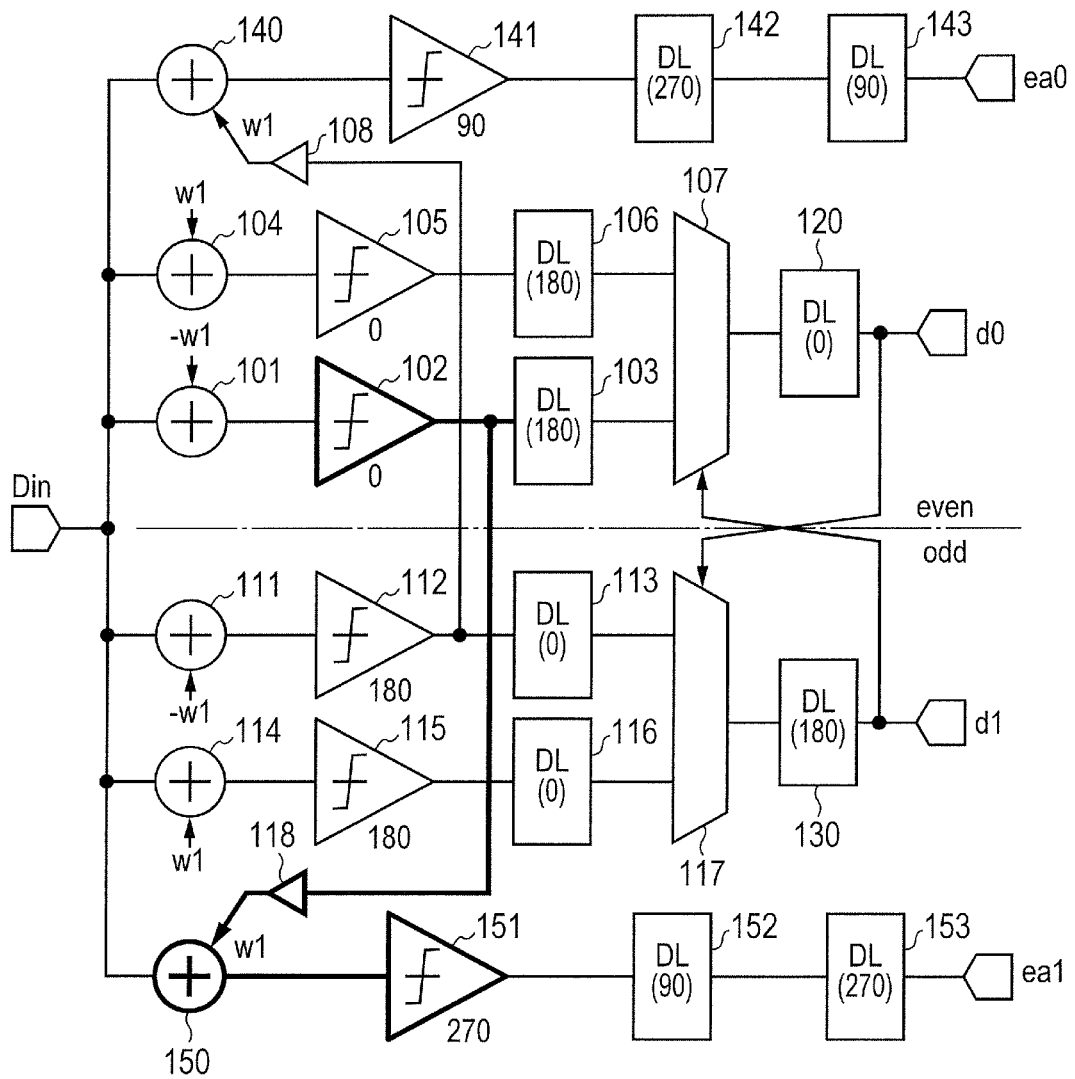
FIG. 3 is a schematic diagram of a sampling circuit according to the first embodiment.

FIG. 3 is a circuit diagram of a decision feedback equalizer 10b used as the decision feedback equalizer 10 according to the first embodiment. As shown in FIG. 3, the decision feedback equalizer 10b according to the first embodiment has basically the same circuit configuration as the decision feedback equalizer 10a shown in FIG. 2, but differs from the decision feedback equalizer 10a in terms of feedback paths to the edge sampling circuits. More specifically, in the decision feedback equalizer 10b, data values outputted from the data samplers 102, 112 are fed back to the mixers 150, 140 in the respective sampling circuits.

That is, in the decision feedback equalizer 10b according to the first embodiment, the speculatively sampled data value is fed back to the edge sampling circuit. Such a configuration of the decision feedback equalizer 10b according to the first embodiment eases a timing restriction on a critical path formed as the feedback path for feeding back the data value to the edge sampling circuit. Hereinafter, a problem with this critical path will be described.

In the decision feedback equalizer 10a shown in FIG. 2, the data value that is outputted from the selector 107 needs to be fed back to the edge sampling circuit in time for the subsequent edge sampling processing. Accordingly, in the decision feedback equalizer 10a, the feedback path to the edge sampling circuit is a critical path. In the critical path, it is necessary to dispose many CTS (clock tree synthesis) buffers etc. to transmit the signal in a short time, which disadvantageously increases the power consumption.

Figure 4:
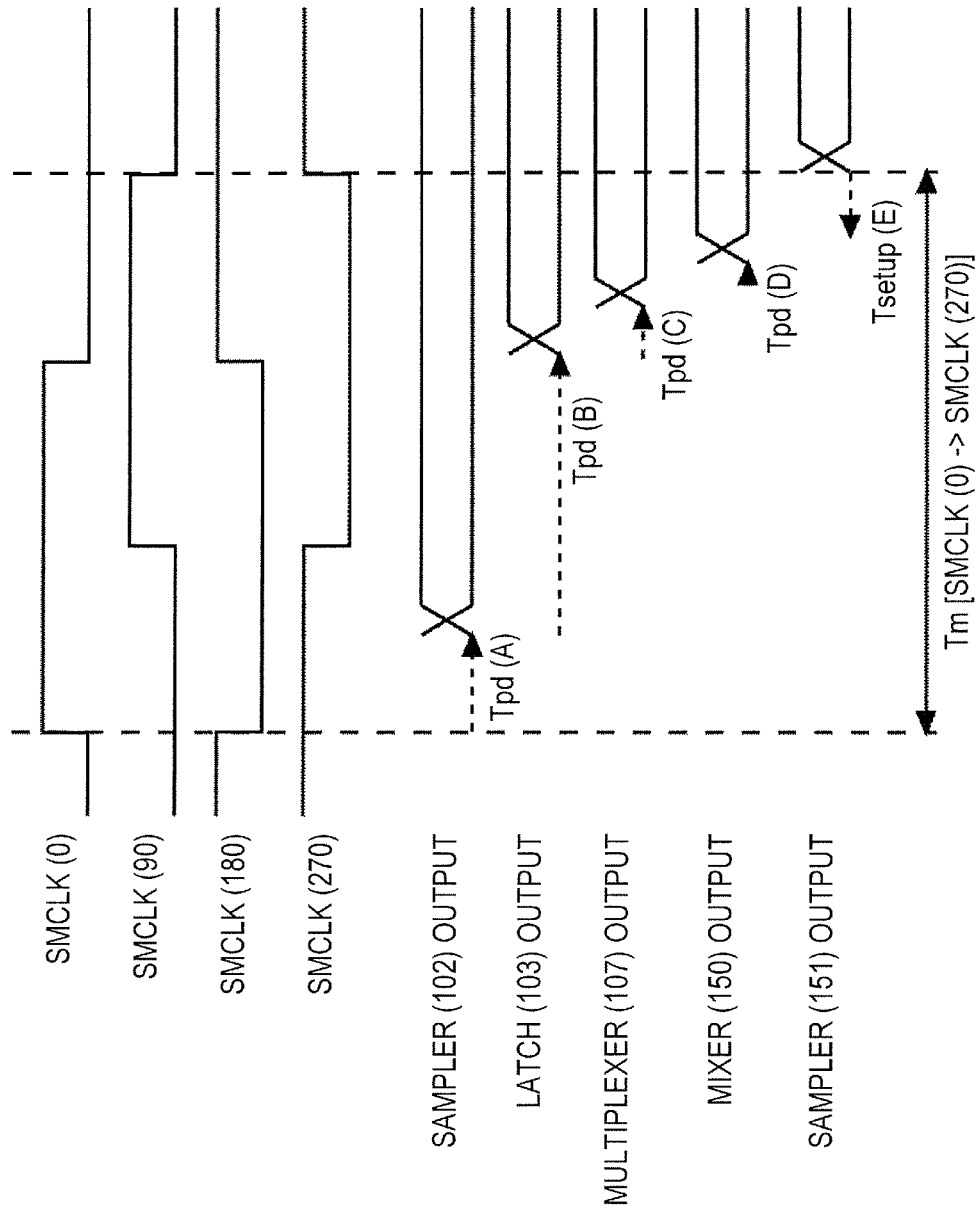
FIG. 4 is a timing chart of a feedback path to an edge sampling circuit in the sampling circuit shown in FIG. 2.
Figure 5:
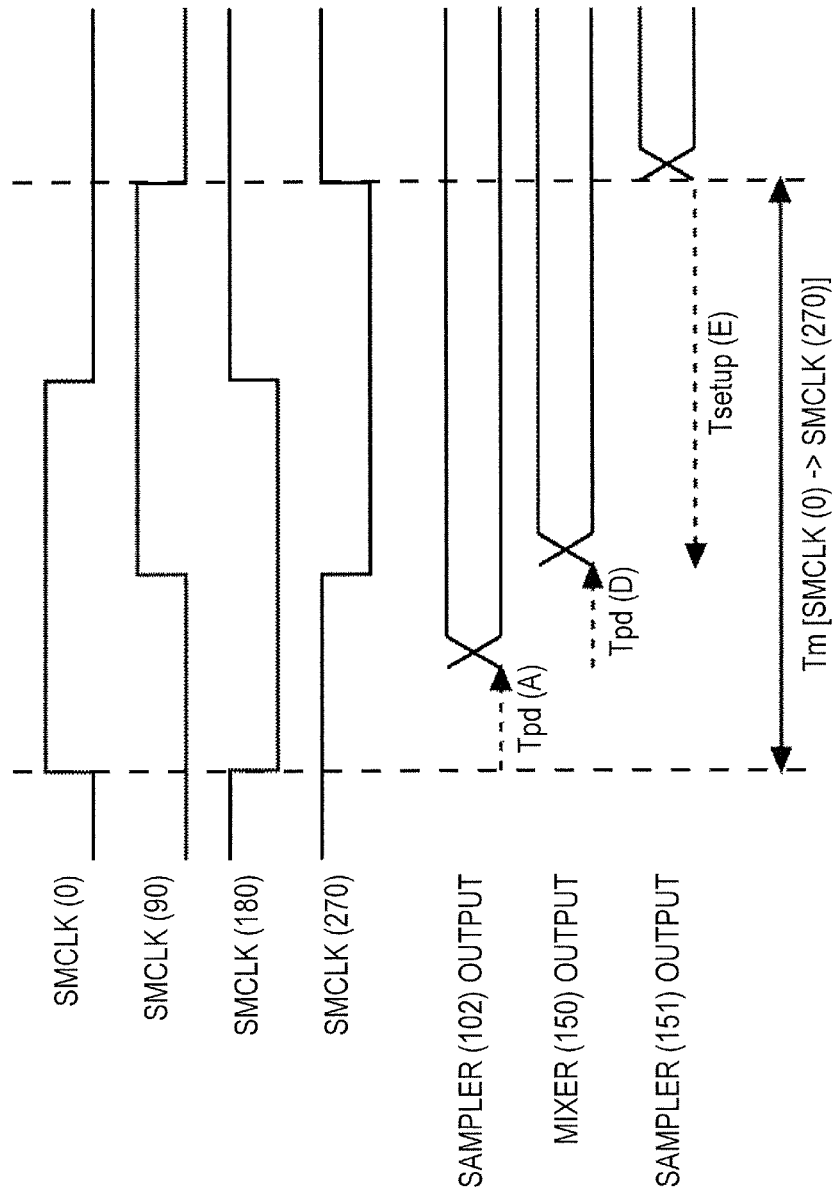
FIG. 5 is a timing chart of a feedback path to an edge sampling circuit in the sampling circuit shown in FIG. 3.

On the other hand, in the decision feedback equalizer 10b shown in FIG. 3, the number of circuit stages provided in the feedback path for feeding back the data value to the edge sampling circuit is smaller than in the decision feedback equalizer 10a. That is, in the decision feedback equalizer 10b, a delay caused by circuit elements provided on the feedback path is smaller than in the decision feedback equalizer 10a, which can ease the timing restriction on the critical path. FIG. 4 is a timing chart of the feedback path in the decision feedback equalizer 10a shown in FIG. 2, and FIG. 5 is a timing chart of the feedback path in the decision feedback equalizer 10b shown in FIG. 3. The timing restriction on the critical path will be described with reference to the timing charts of FIGS. 4 and 5.

In FIGS. 4 and 5, four sampling clocks having different phases by 90 degrees are used as the multiphase sampling clocks SMCLK, and represented as follows. A reference sampling clock is represented as a sampling clock SMCLK (0). A sampling clock whose phase is delayed from the sampling clock SMCLK (0) by 90 degrees is represented as a sampling clock SMCLK (90). A sampling clock whose phase is delayed from the sampling clock SMCLK (0) by 180 degrees is represented as a sampling clock SMCLK (180). A sampling clock whose phase is delayed from the sampling clock SMCLK (0) by 270 degrees is represented as a sampling clock SMCLK (270).

As shown in FIG. 4, in the decision feedback equalizer 10a, the data sampler 102 samples the data value by the sampling clock SMCLK (0). A delay time until the data sampler 102 outputs the data value is Tpd(A). Then, the D latch circuit 103 latches the data value outputted from the data sampler 102, in accordance with the sampling clock SMCLK (180). A delay time from when the data sampler 102 outputs the data value until when the D latch circuit 103 outputs the data value is Tpd(B).

Then, the data value outputted from the D latch circuit 103 is outputted from the selector 107. A delay time from when the D latch circuit 103 outputs the data value until when the selector 107 outputs the data value is Tpd(C). Then, the data value outputted from the selector 107 is transmitted to the mixer 150. A delay time until the mixer 150 causes the output to transition in accordance with the data value outputted from the selector 107 is Tpd(D).

In the edge sampling circuit, the edge sampler 151 samples the output value of the mixer 150 by the sampling clock SMCLK (270). Therefore, in the decision feedback equalizer 10a, a time Tsetup(E) obtained by subtracting the sum of the delay times Tpd(A), Tpd(B), Tpd(C), and Tpd(D) from a time Tm from the rising edge of the sampling clock SMCLK (0) to the rising edge of the sampling clock SMCLK (270) needs to be equal to or greater than the setup time of the edge sampler 151.

On the other hand, in the decision feedback equalizer 10b according to the first embodiment, the feedback path is formed without passing through the D latch circuit 103 and the selector 107, as shown in FIG. 3. Therefore, in the decision feedback equalizer 10b, the delay times included in the time Tm are only the delay time Tpd(A) caused by the data sampler 102 and the delay time Tpd(D) caused by the mixer 150, as shown in FIG. 5. That is, the decision feedback equalizer 10b enables the time Tsetup(E) needed as the setup time of the edge sampler 151 to be greater than that of the decision feedback equalizer 10a shown in FIG. 2.

As described above, in comparison with the decision feedback equalizer 10a, the decision feedback equalizer 10b according to the first embodiment can ease the timing restriction on the feedback path and reduce the power consumption of the decision feedback equalizer 10. However, in the decision feedback equalizer 10b, since the speculatively sampled data value is fed back to the edge sampling circuit, there might occur a problem with the validity of the output edge value. However, in the semiconductor device 1 according to the first embodiment, the problem with the validity of the edge value is solved by using the pattern filter 20 etc. Hereinafter, the details of the semiconductor device 1 according to the first embodiment including processing for determining the validity of the edge value will be described.

Figure 6:
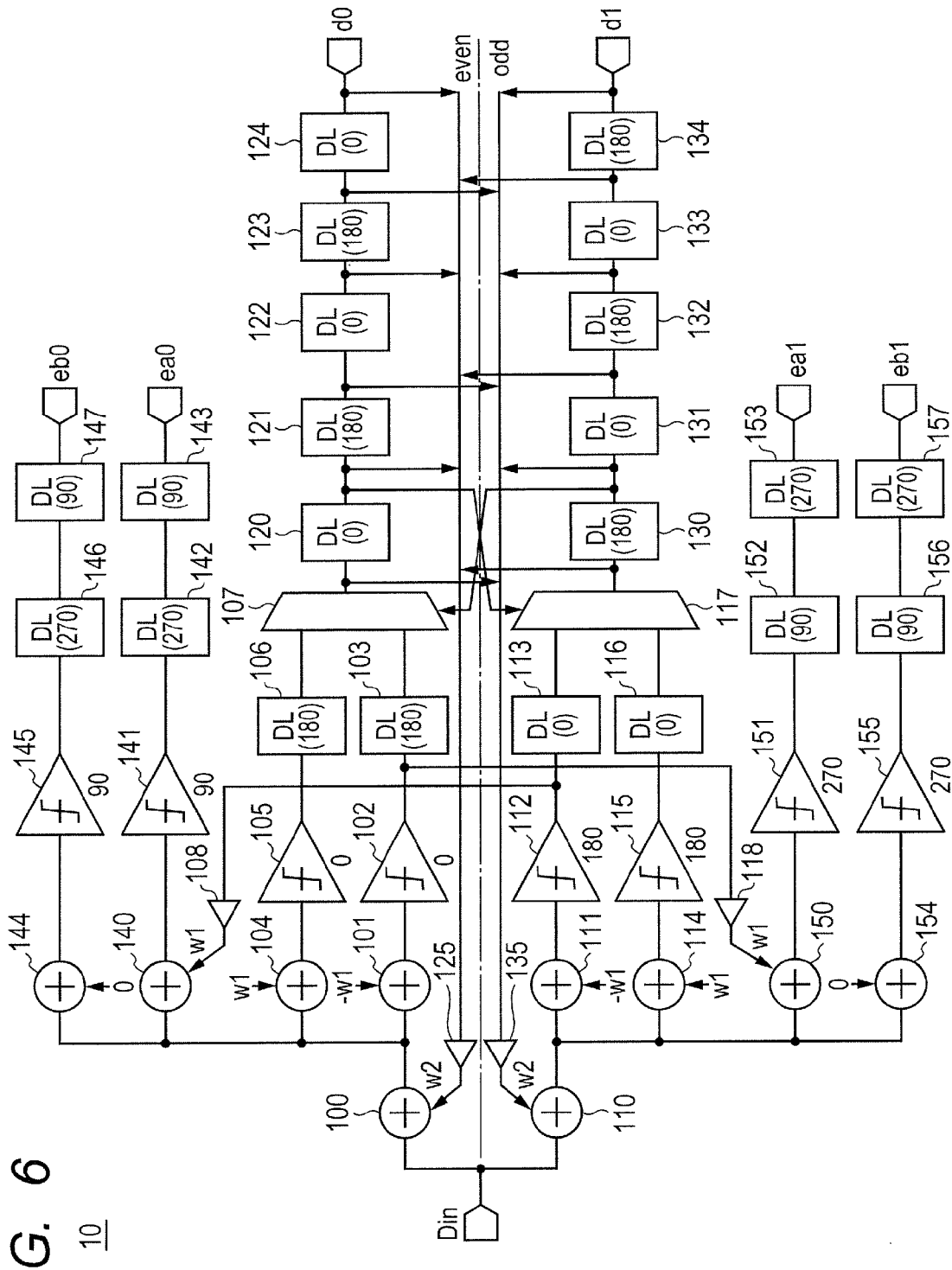
FIG. 6 is a circuit diagram of the sampling circuit according to the first embodiment.

FIG. 6 is a detailed circuit diagram of the sampling circuit (hereinafter referred to as the decision feedback equalizer) 10 of the semiconductor device 1 according to the first embodiment. The decision feedback equalizer 10 shown in FIG. 6 is configured by adding second edge sampling circuits and shift registers to the decision feedback equalizer 10b shown in FIG. 3. While the decision feedback equalizer 10 shown in FIG. 6 is substantially the same as the decision feedback equalizer 10b shown in FIG. 3, the decision feedback equalizer 10 is closer to an actual circuit.

The decision feedback equalizer 10 shown in FIG. 6 has a first sampling circuit for sampling an odd-numbered data value and an edge value corresponding to the data value and a second sampling circuit for sampling an even-numbered data value and an edge value corresponding to the data value.

In the example shown in FIG. 6, the first sampling circuit has mixers 100, 101, 104, 140, 144, data samplers 102, 105, edge samplers 141, 145, D latch circuits 103, 106, 120 to 124, 142, 143, 146, 147, a selector 107, and buffer circuits 108, 125. The second sampling circuit has mixers 110, 111, 114, 150, 154, data samplers 112, 115, edge samplers 151, 155, D latch circuits 113, 116, 130 to 134, 152, 153, 156, 157, a selector 117, and buffer circuits 118, 135.

The mixer 100 provides the result of adding an offset w2 to the input signal Din to a first data sampling circuit, a second data sampling circuit, a first edge sampling circuit, and a second edge sampling circuit in the subsequent stages. The offset w2 is calculated from the second tap data value or an earlier one. As for the data value, a data value inputted in the last sampling period is referred to as the first tap data value, a data value inputted in the second last sampling period is referred to as the second tap data value, and a data value inputted in the third last sampling period is referred to as the third tap data value.

The mixer 101, the data sampler 102, and the D latch circuit 103 configure the first data sampling circuit of the first sampling circuit. The first data sampling circuit adds a negative offset to the signal level of the input signal Din, samples the input signal, and outputs a first data value. The mixer 101 adds the negative offset −w1 to the input signal Din outputted from the mixer 100, and outputs it to the data sampler 102. The data sampler 102 samples the input signal Din outputted from the mixer 101, in accordance with the sampling clock SMCLK (0), and outputs the first data value. The D latch circuit 103 latches the first data value outputted from the data sampler 102, in accordance with the sampling clock SMCLK (180). The negative offset −w1 added by the mixer 101 is the inverted value of an offset value generated based on the logic level of the first tap data.

The mixer 104, the data sampler 105, and the D latch circuit 106 configure the second data sampling circuit of the first sampling circuit. The second data sampling circuit adds a positive offset to the signal level of the input signal Din, samples the input signal, and outputs a second data value. The mixer 104 adds the positive offset w1 to the input signal Din outputted from the mixer 100, and outputs it to the data sampler 105. The data sampler 105 samples the input signal Din outputted from the mixer 104, in accordance with the sampling clock SMCLK (0), and outputs the second data value. The D latch circuit 106 latches the second data value outputted from the data sampler 105, in accordance with the sampling clock SMCLK (180). The positive offset w1 added by the mixer 104 is the offset value generated based on the logic level of the first tap data.

The mixer 140, the edge sampler 141, and the D latch circuits 142, 143 configure the first edge sampling circuit of the first sampling circuit. The first edge sampling circuit adds a first offset to the signal level of the input signal Din, and outputs a first edge value ea0 indicating the value of an edge part of the input signal Din. The mixer 140 adds the first offset w1 generated based on a data value outputted by the data sampler 112 to the input signal Din outputted by the mixer 100, and outputs it to the edge sampler 141. The edge sampler 141 samples the input signal Din outputted from the mixer 140, in accordance with the sampling clock SMCLK (90), and outputs the first edge value ea0. The D latch circuit 142 latches the first edge value ea0 outputted from the edge sampler 141, in accordance with the sampling clock SMCLK (270). The D latch circuit 143 latches the first edge value ea0 outputted from the D latch circuit 142, in accordance with the sampling clock SMCLK (90).

The mixer 144, the edge sampler 145, and the D latch circuits 146, 147 configure the second edge sampling circuit of the first sampling circuit. The second edge sampling circuit adds a second offset to the signal level of the input signal Din, and outputs a second edge value eb0 indicating the value of an edge part of the input signal Din. The mixer 144 adds the second offset whose value is zero to the input signal Din outputted from the mixer 100, and outputs it to the edge sampler 145. That is, the mixer 144 performs an adjustment for the delay between the first edge sampling circuit and the second edge sampling circuit. The edge sampler 145 samples the input signal Din outputted from the mixer 144, in accordance with the sampling clock SMCLK (90), and outputs the second edge value eb0. The D latch circuit 146 latches the second edge value eb0 outputted from the edge sampler 145, in accordance with the sampling clock SMCLK (270). The D latch circuit 147 latches the second edge value eb0 outputted from the D latch circuit 146, in accordance with the sampling clock SMCLK (90).

Further, the D latch circuits 120 to 124 configure a shift register. In this shift register, the odd-numbered registers operate based on the sampling clock SMCLK (0), and the even-numbered registers operate based on the sampling clock SMCLK (180). The D latch circuits 120 to 124 shift and output the data value d0 selected by the selector 107, based on the sampling clock SMCLK (0) and the sampling clock SMCLK (180).

The mixer 110 provides the result of adding the offset w2 to the input signal Din to a first data sampling circuit, a second data sampling circuit, a first edge sampling circuit, and a second edge sampling circuit in the subsequent stages. The offset w2 is calculated from the second tap data value or an earlier one.

The mixer 111, the data sampler 112, and the D latch circuit 113 configure the first data sampling circuit of the second sampling circuit. The first data sampling circuit adds a negative offset to the signal level of the input signal Din, samples the input signal, and outputs a first data value. The mixer 111 adds the negative offset −w1 to the input signal Din outputted from the mixer 110, and outputs it to the data sampler 112. The data sampler 112 samples the input signal Din outputted from the mixer 111, in accordance with the sampling clock SMCLK (180), and outputs the first data value. The D latch circuit 113 latches the first data value outputted from the data sampler 112, in accordance with the sampling clock SMCLK (0). The negative offset −w1 added by the mixer 101 is the inverted value of the offset value generated based on the logic level of the first tap data.

The mixer 114, the data sampler 115, and the D latch circuit 116 configure the second data sampling circuit of the second sampling circuit. The second data sampling circuit adds a positive offset to the signal level of the input signal Din, samples the input signal, and outputs a second data value. The mixer 114 adds the positive offset w1 to the input signal Din outputted from the mixer 110, and outputs it to the data sampler 115. The data sampler 115 samples the input signal Din outputted from the mixer 114, in accordance with the sampling clock SMCLK (180), and outputs the second data value. The D latch circuit 116 latches the second data value outputted from the data sampler 115, in accordance with the sampling clock SMCLK (0). The positive offset w1 added by the mixer 114 is the offset value generated based on the logic level of the first tap data.

The mixer 150, the edge sampler 151, and the D latch circuits 152, 153 configure the first edge sampling circuit of the second sampling circuit. The first edge sampling circuit adds a first offset to the signal level of the input signal Din, and outputs a first edge value ea1 indicating the value of an edge part of the input signal Din. The mixer 150 adds the first offset w1 generated based on a data value outputted by the data sampler 102 to the input signal Din outputted by the mixer 110, and outputs it to the edge sampler 151. The edge sampler 151 samples the input signal Din outputted from the mixer 150, in accordance with the sampling clock SMCLK (270), and outputs the first edge value ea1. The D latch circuit 152 latches the first edge value ea1 outputted from the edge sampler 151, in accordance with the sampling clock SMCLK (90). The D latch circuit 153 latches the first edge value ea1 outputted from the D latch circuit 152, in accordance with the sampling clock SMCLK (270).

The mixer 154, the edge sampler 155, and the D latch circuits 156, 157 configure the second edge sampling circuit of the second sampling circuit. The second edge sampling circuit adds a second offset to the signal level of the input signal Din, and outputs a second edge value eb1 indicating the value of an edge part of the input signal Din. The mixer 154 adds the second offset whose value is zero to the input signal Din outputted from the mixer 110, and outputs it to the edge sampler 155. That is, the mixer 154 performs an adjustment for the delay between the first edge sampling circuit and the second edge sampling circuit. The edge sampler 155 samples the input signal Din outputted from the mixer 154, in accordance with the sampling clock SMCLK (270), and outputs the second edge value eb1. The D latch circuit 156 latches the second edge value eb1 outputted from the edge sampler 155, in accordance with the sampling clock SMCLK (90). The D latch circuit 157 latches the second edge value eb1 outputted from the D latch circuit 156, in accordance with the sampling clock SMCLK (270).

Further, the D latch circuits 130 to 134 configure a shift register. In this shift register, the odd-numbered registers operate based on the sampling clock SMCLK (180), and the even-numbered registers operate based on the sampling clock SMCLK (0). The D latch circuits 130 to 134 shift the data value d1 selected by the selector 117, based on the sampling clock SMCLK (0) and the sampling clock SMCLK (180), and output the data value d1.

Further, in the first sampling circuit, the first data value outputted from the first data sampling circuit or the second data value outputted from the second data sampling circuit is selected based on the output value of the first shift register (e.g., the D latch circuit 130) in the second sampling circuit. That is, in the first sampling circuit, the data value in the current sampling period is determined based on the data value determined 1 UI ago based on the determination result in the last sampling period. In the second sampling circuit, the first data value outputted from the first data sampling circuit or the second data value outputted from the second data sampling circuit is selected based on the output value of the first shift register (e.g., the D latch circuit 120) in the first sampling circuit. That is, in the second sampling circuit, the data value in the current sampling period is determined based on the data value determined 1 UI ago based on the determination result in the last sampling period.

Further, the buffer circuits 125, 135 output the offset w2 based on the output of the shift register in the first sampling circuit and the output of the shift register in the second sampling circuit. Since the buffer circuit 125 is provided in the first sampling circuit corresponding to the odd-numbered data value, the buffer circuit 125 outputs the offset w2 based on the data value latched by the D latch with the sampling clock SMCLK (0) used for sampling the odd-numbered data value. Since the buffer circuit 135 is provided in the second sampling circuit corresponding to the even-numbered data value, the buffer circuit 135 outputs the offset w2 based on the data value latched by the D latch with the sampling clock SMCLK (180) used for sampling the even-numbered data value.

Further, in the decision feedback equalizer 10 shown in FIG. 6, the first sampling circuit and the second sampling circuit output the data value by selecting, by the selector, the first data value or the second data value obtained by sampling the input signal with the fixed offset speculatively added, in accordance with the determination result in the previous sampling period.

Further, in the decision feedback equalizer 10 shown in FIG. 6, at least one of the first offset and the second offset in one sampling circuit is determined based on the data value acquired from a location other than between the selector and the shift register in the other sampling circuit. More specifically, in the decision feedback equalizer 10 according to the first embodiment, the first data sampling circuit of the other sampling circuit (e.g., the second sampling circuit corresponding to the even-numbered data) has the first sampler (e.g., the data sampler 112) which outputs the data value corresponding to the logic level of data contained in the input signal Din and the first latch circuit (e.g., the D latch circuit 113) which latches the output of the data sampler 112, using one of the multiphase sampling clocks, and outputs the latched data as the first data value. Further, in the decision feedback equalizer 10, the first offset w1 provided to the mixer 140 in one sampling circuit (e.g., the first sampling circuit corresponding to the odd-numbered data) is determined based on the data value outputted from the data sampler 112, and a preset fixed value is provided as the second offset in one sampling circuit.

Figure 7:
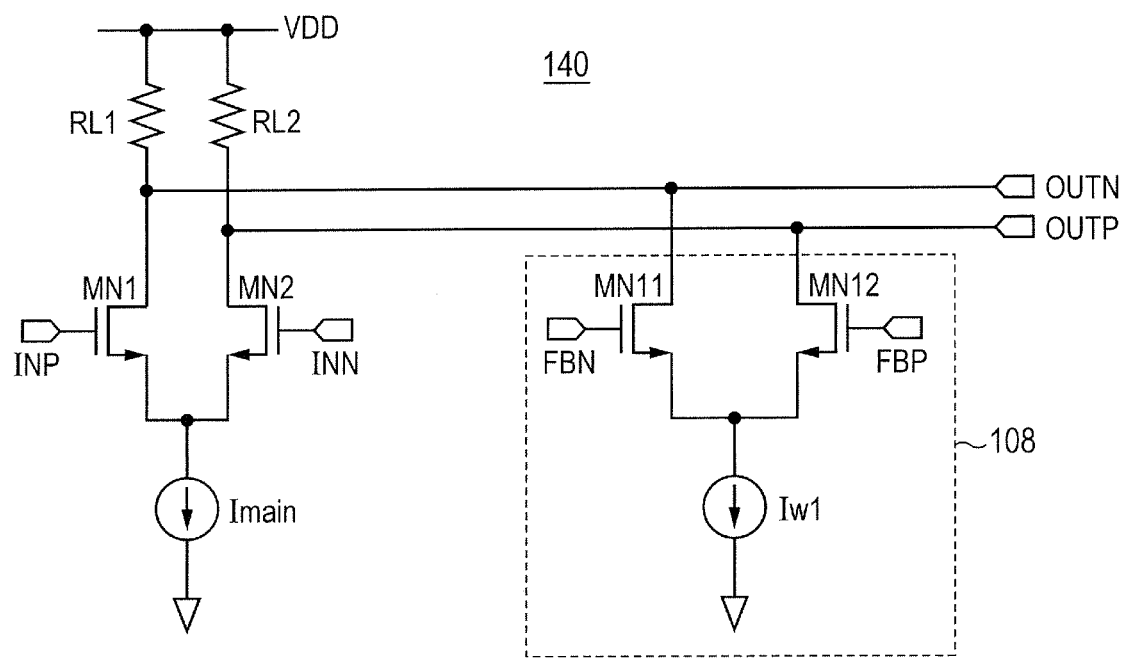
FIG. 7 is a circuit diagram of a mixer according to the first embodiment.

The circuits of the mixers 140, 144, 150, 154 in the decision feedback equalizer 10 will be described. The mixers have substantially the same configuration, and will therefore be described by way of example of the mixer 140. FIG. 7 is a circuit diagram of the mixer 140 according to the first embodiment. In the decision feedback equalizer 10 according to the first embodiment, the input signal Din and the like are transmitted in the form of differential signals.

The circuit diagram of FIG. 7 also shows the buffer circuit 108 for providing the first offset w1 to the mixer 140. The mixer 140 has NMOS transistors MN1, MN2, load resistors RL1, RL2, and a current source. The buffer circuit 108 has NMOS transistors MN11, MN12, and a current source.

The NMOS transistors MN1, MN2 configure a differential pair. A positive signal INP of the input signal Din is provided to the gate of the NMOS transistor MN1. A negative signal INN of the input signal Din is provided to the gate of the NMOS transistor MN2. The current source supplies a current Imain through the differential pair. Further, the load resistor RL1 is coupled between the drain of the NMOS transistor MN1 and a power line to which a power supply voltage VDD is supplied. The load resistor RL2 is coupled between the drain of the NMOS transistor MN2 and the power line to which the power supply voltage VDD is supplied. Further, a first output terminal OUTN is coupled to the drain of the NMOS transistor MN1 through a first output line. A second output terminal OUTP is coupled to the drain of the NMOS transistor MN2 through a second output line.

Further, in the buffer circuit 108, the NMOS transistors MN11, MN12 configure a differential pair. A negative signal FBN of differential signals provided as the data value outputted from the data sampler 112 is provided to the gate of the NMOS transistor MN11. A positive signal FBP of the differential signals provided as the data value outputted from the data sampler 112 is provided to the gate of the NMOS transistor MN12. The current source supplies a current Iw1 through the differential pair. Further, the drain of the NMOS transistor MN11 is coupled to the first output line. The drain of the NMOS transistor MN12 is coupled to the second output line.

The mixer 140 selects whether to pass the current Imain of the current source through the load resistor RL1 or the load resistor RL2 in accordance with the level of the input signal Din, thereby switching the logic level of the output of the mixer 140. Further, the buffer circuit 108 selects whether to pass the current Iw1 through the load resistor RL1 or the load resistor RL2 in accordance with the logic level of the data value. That is, the buffer circuit 108 passes the current Iw1 through the first output line and the second output line, thereby providing the offset to the signal level of the mixer 140.

As described above, in the decision feedback equalizer 10 according to the first embodiment, the first data value outputted from the data samplers 102, 112 is fed back to the edge sampling circuit. That is, the decision feedback equalizer 10 according to the first embodiment determines the first offset to one sampling circuit in the current sampling period, based on the first data value outputted in the last sampling period. Thereby, the decision feedback equalizer 10 according to the first embodiment eases the timing restriction on the feedback path. Further, the decision feedback equalizer 10 according to the first embodiment alternately outputs odd data information including the data value d0, the first edge value ea0, and the second edge value eb0 and even data information including the data value d1, the first edge value ea1, and the second edge value eb1 every half cycle of the sampling clock.

Figure 8:
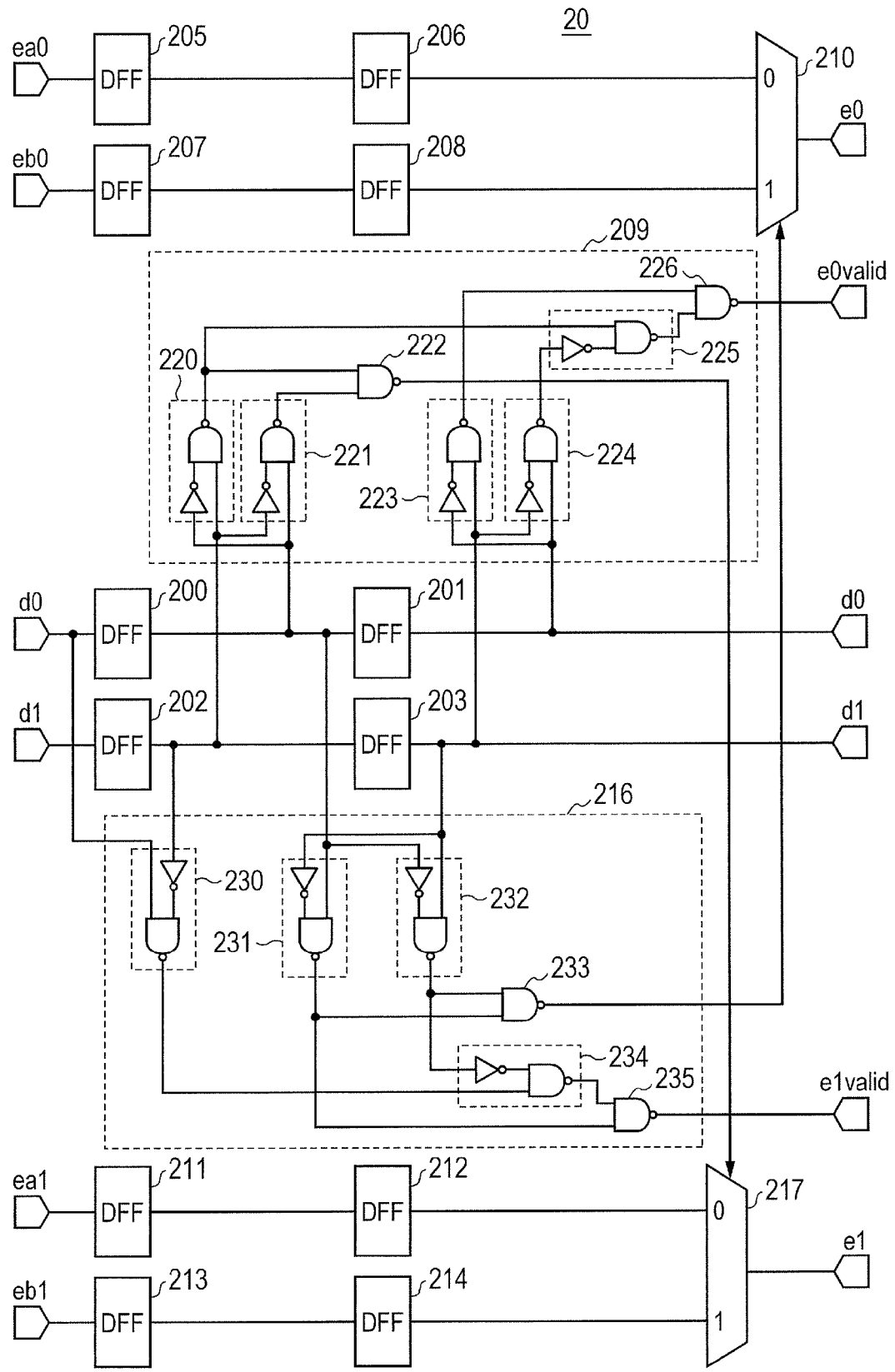
FIG. 8 is a circuit diagram of a pattern filter according to the first embodiment.

The pattern filter 20 determines the validity of the edge value, based on the successively outputted odd-numbered data d0 and even-numbered data d1. The pattern filter 20 selects one of the two edge values included in each of the odd data information and the even data information, based on the data values d0, d1. Hereinafter, the pattern filter 20 according to the first embodiment will be described in detail. FIG. 8 is a detailed circuit diagram of the pattern filter 20.

As shown in FIG. 8, the pattern filter 20 has flip-flop circuits 200 to 203, 205 to 208, 211 to 214, selectors 210, 217, and edge validity determination circuits 209, 216.

The flip-flop circuits 200, 201 configure a shift register, which shifts and outputs the data value d0 in accordance with the sampling clock. The flip-flop circuits 202, 203 configure a shift register, which shifts and outputs the data value d1 in accordance with the sampling clock.

The flip-flop circuits 205, 206 configure a shift register, which shifts the first edge value ea0 in accordance with the sampling clock and outputs it to one terminal (e.g., a terminal selected when a selection signal is 0) of the selector 210. The flip-flop circuits 207, 208 configure a shift register, which shifts the second edge value eb0 in accordance with the sampling clock and outputs it to the other terminal (e.g., a terminal selected when the selection signal is 1) of the selector 210.

The flip-flop circuits 211, 212 configure a shift register, which shifts the first edge value ea1 in accordance with the sampling clock and outputs it to one terminal (e.g., a terminal selected when a selection signal is 0) of the selector 217. The flip-flop circuits 213, 214 configure a shift register, which shifts the second edge value eb1 in accordance with the sampling clock and outputs it to the other terminal (e.g., a terminal selected when the selection signal is 1) of the selector 217.

The edge validity determination circuit 209 outputs the validity flag e0valid indicating the validity of the first edge value ea0 or the second edge value eb0, based on the data values d1, d0. Further, the edge validity determination circuit 209 outputs the selection signal to the selector 217 based on the data values d1, d0.

The edge validity determination circuit 209 has data transition determination circuits 220, 221, 223, 224, 225 and NAND circuits 222, 226. The data transition determination circuits 220, 221, 223, 224, 225 output 0 only if two input values meet a predetermined condition. For example, the data transition determination circuits 220, 221, 223, 224, 225 output 0 only if one value is 1 and the other value is 0.

The data transition determination circuit 220 outputs 0 only if the data value d0 outputted from the flip-flop circuit

200 is 0 and the data value d1 outputted from the flip-flop circuit 202 is 1. That is, the data transition determination circuit 220 outputs 0 if the transition of the data value from the odd-numbered data value d0 to the even-numbered data value d1 is from 0 to 1 or the transition of the data value from the even-numbered data value d1 to the odd-numbered data value d0 is from 1 to 0.

The data transition determination circuit 221 outputs 0 only if the data value d0 outputted from the flip-flop circuit 200 is 1 and the data value d1 outputted from the flip-flop circuit 202 is 0. That is, the data transition determination circuit 221 outputs 0 if the transition of the data value from the odd-numbered data value d0 to the even-numbered data value d1 is from 1 to 0 or the transition of the data value from the even-numbered data value d1 to the odd-numbered data value d0 is from 0 to 1.

The NAND circuit 222 outputs the inverted AND between the output of the data transition determination circuit 220 and the output of the data transition determination circuit 221, as the selection signal to the selector 217. The values inputted to the NAND circuit 222 both become 1 in two cases where the transition of three successive data values is 110 and 001. That is, in the two cases where the transition of three successive data values is 110 and 001, the edge validity determination circuit 209 outputs 0 as the selection signal, and the selector 217 outputs the first edge value ea1 as the edge value e1.

The data transition determination circuit 223 outputs 0 only if the data value d0 outputted from the flip-flop circuit 201 is 0 and the data value d1 outputted from the flip-flop circuit 203 is 1. That is, the data transition determination circuit 223 outputs 0 if the transition of the data value from the odd-numbered data value d0 to the even-numbered data value d1 is from 0 to 1 or if the transition of the data value from the even-numbered data value d1 to the odd-numbered data value d0 is from 1 to 0.

The data transition determination circuit 224 outputs 0 only if the data value d0 outputted from the flip-flop circuit 201 is 1 and the data value d1 outputted from the flip-flop circuit 203 is 0. That is, the data transition determination circuit 224 outputs 0 if the transition of the data value from the odd-numbered data value d0 to the even-numbered data value d1 is from 1 to 0 or the transition of the data value from the even-numbered data value d1 to the odd-numbered data value d0 is from 0 to 1.

The data transition determination circuit 225 outputs 0 only if the output value of the data transition determination circuit 220 is 1 and the output value of the data transition determination circuit 224 is 0. The NAND circuit 226 outputs the inverted AND between the output value of the data transition determination circuit 225 and the output value of the data transition determination circuit 223, as the validity flag e0valid. The validity flag e0valid indicates the validity of the edge value e0 outputted from the selector 210. The validity flag e0valid indicates that the edge value e0 is valid if the value is 1 for example. The details of cases where the validity flag e0valid indicates a valid state and indicates an invalid state will be described later.

The edge validity determination circuit 216 has data transition determination circuits 230, 231, 232, 234, and NAND circuits 233, 235. The data transition determination circuits 230, 231, 232, 234 output 0 only if two input values meet a predetermined condition. For example, the data transition determination circuits 230, 231, 232, 234 output 0 only if one value is 1 and the other value is 0.

The data transition determination circuit 230 outputs 0 only if the data value d0 inputted to the flip-flop circuit 200 is 1 and the data value d1 outputted from the flip-flop circuit 202 is 0. That is, the data transition determination circuit 230 outputs 0 if the transition of the data value from the odd-numbered data value d0 to the even-numbered data value d1 is from 1 to 0 or the transition of the data value from the even-numbered data value d1 to the odd-numbered data value d0 is from 0 to 1.

The data transition determination circuit 231 outputs 0 only if the data value d0 inputted to the flip-flop circuit 201 is 1 and the data value d1 outputted from the flip-flop circuit 203 is 0. That is, the data transition determination circuit 231 outputs 0 if the transition of the data value from the odd-numbered data value d0 to the even-numbered data value d1 is from 1 to 0 or the transition of the data value from the even-numbered data value d1 to the odd-numbered data value d0 is from 0 to 1.

The data transition determination circuit 232 outputs 0 only if the data value d0 inputted to the flip-flop circuit 201 is 0 and the data value d1 outputted from the flip-flop circuit 203 is 1. That is, the data transition determination circuit 232 outputs 0 if the transition of the data value from the odd-numbered data value d0 to the even-numbered data value d1 is from 0 to 1 or the transition of the data value from the even-numbered data value d1 to the odd-numbered data value d0 is from 1 to 0.

The NAND circuit 233 outputs the inverted AND between the output of the data transition determination circuit 231 and the output of the data transition determination circuit 232, as the selection signal to the selector 210. The values inputted to the NAND circuit 233 both become 1 in two cases where the transition of three successive data values is 110 and 001. That is, in the two cases where the transition of three successive data values is 110 and 001, the edge validity determination circuit 216 outputs 0 as the selection signal, and the selector 210 outputs the first edge value ea0 as the edge value e0.

The data transition determination circuit 234 outputs 0 only if the output value of the data transition determination circuit 230 is 1 and the output value of the data transition determination circuit 232 is 0. The NAND circuit 235 outputs the inverted AND between the output value of the data transition determination circuit 231 and the output value of the data transition determination circuit 234, as the validity flag e1valid. The validity flag e1valid indicates the validity of the edge value e1 outputted from the selector 217. The validity flag e1valid indicates that the edge value e1 is valid if the value is 1 for example. The details of cases where the validity flag e1valid indicates a valid state and indicates an invalid state will be described later.

Next, the operation of the pattern filter 20 according to the first embodiment will be described. The waveform shape of the serial signal provided as the input signal Din is degraded by inter-symbolic interference (ISI) due to the characteristics of a transmission line. The decision feedback equalizer 10 correctly receives the degraded waveform, using the offset.

Figure 9:
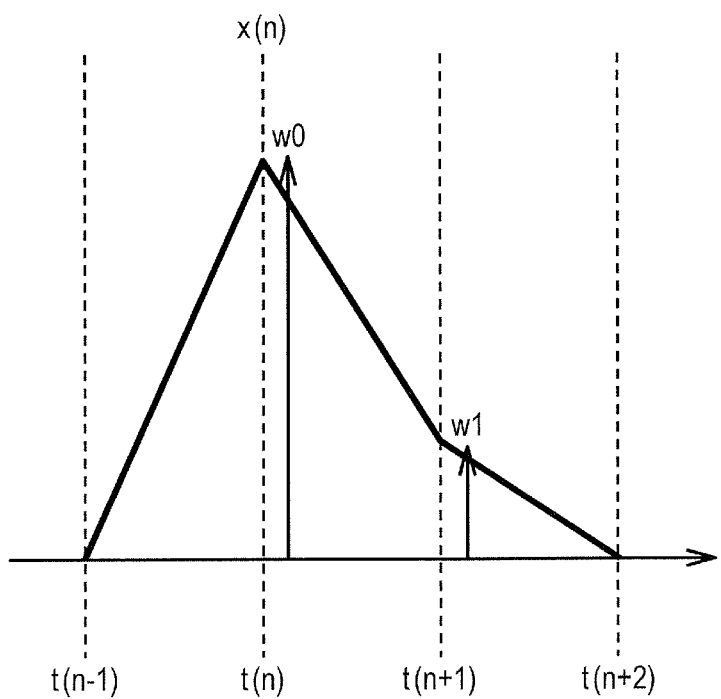
FIG. 9 is a timing chart showing the relationship between a data value inputted to the semiconductor device according to the first embodiment and the signal level of an input signal.

First, the waveform degradation due to ISI will be described. FIG. 9 is a timing chart showing the relationship between the data value inputted to the semiconductor device according to the first embodiment and the signal level of the input signal. In the example shown in FIG. 9, the response of the 1-bit data value is shown.

As shown in FIG. 9, in the case where 1-bit data whose data value x(n) is 1 (signal level is w0) is inputted at timing t(n), a signal level of w1 remains at timing t(n+1). Thus, the signal level of the last input signal remains at the next data input timing and influences the signal level of the next input data value by ISI.

Figure 10:
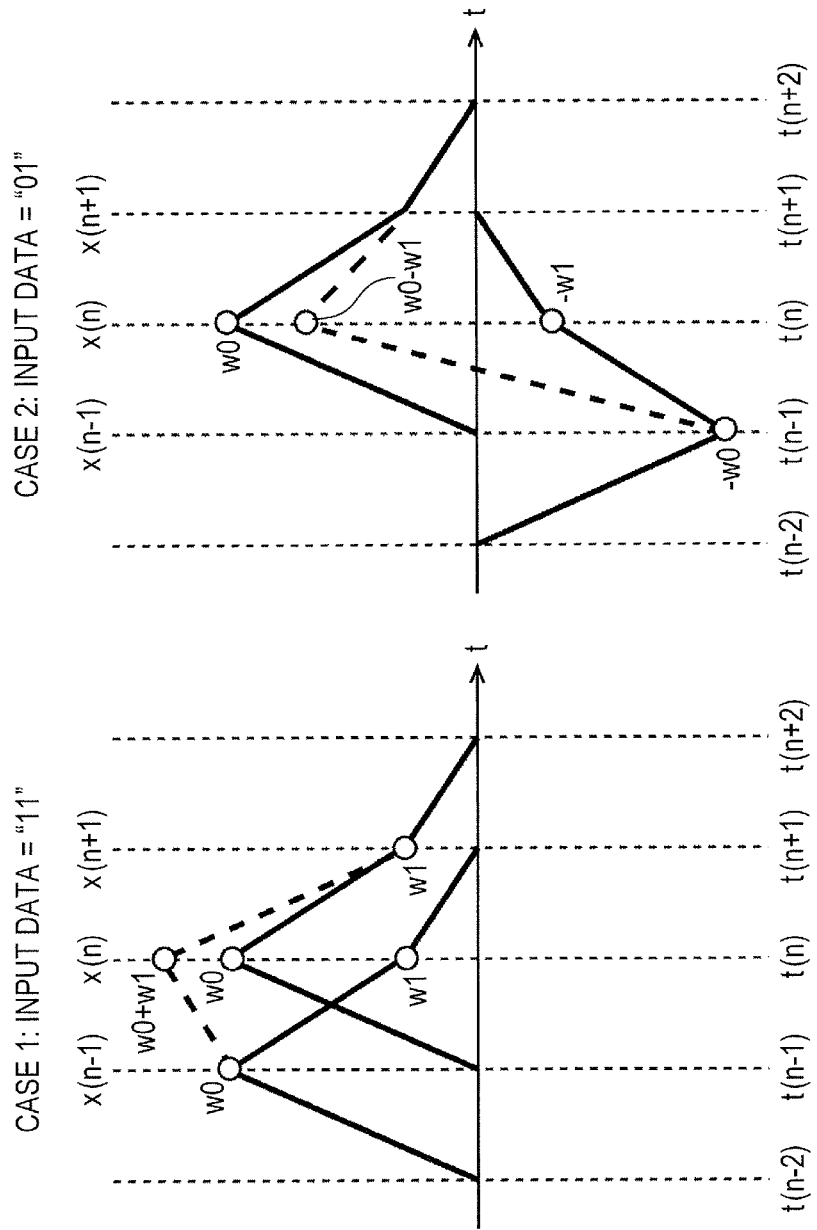
FIG. 10 is a timing chart showing the relationship between data values successively inputted to the semiconductor device according to the first embodiment and the signal level of the input signal.

Next, FIG. 10 is a timing chart showing the relationship between data values successively inputted to the semiconductor device according to the first embodiment and the signal level of the input signal. FIG. 10 shows the response of 2-bit data whose data values are 1 as case 1, and shows the response of 2-bit data whose data values are 0 and 1 as case 2.

In case 1 of FIG. 10, the signal level w1 of the data value x(n−1) inputted at timing t(n−1) remains at timing t(n), so that the signal level of the data value x(n) inputted at timing t(n) becomes w0+w1. Accordingly, in case 1, in order to correctly sample the signal level of the data value x(n), it is necessary to provide an offset of +w1 to the signal level of the input signal for transferring the data value x(n). That is, in case 1, to determine the signal level, it is necessary to use the signal level obtained by subtracting w1 from the signal level of the input signal. That is, if the signal level obtained by subtracting w1 from the signal level of the input signal is equal to or more than 0, the data value is determined to be 1. If the signal level is less than 0, the data value is determined to be 0.

Further, in case 2 of FIG. 10, the signal level −w1 of the data value inputted at timing t(n−1) remains at timing t(n), so that the signal level of the data value inputted at timing t(n) becomes w0−w1. Accordingly, in case 2, in order to correctly sample the signal level of the data value x(n), it is necessary to provide an offset of −w1 to the signal level of the input signal for transferring the data value x(n). That is, in case 2, to determine the signal level, it is necessary to use the signal level obtained by adding w1 to the signal level of the input signal. That is, if the signal level obtained by adding w1 to the signal level of the input signal is equal to or more than 0, the data value is determined to be 1. If the signal level is less than 0, the data value is determined to be 0.

Thus, by providing the offset in accordance with the temporal change of successively inputted data values to determine the signal level, it is possible to increase a margin for reception level variation.

Figure 11:
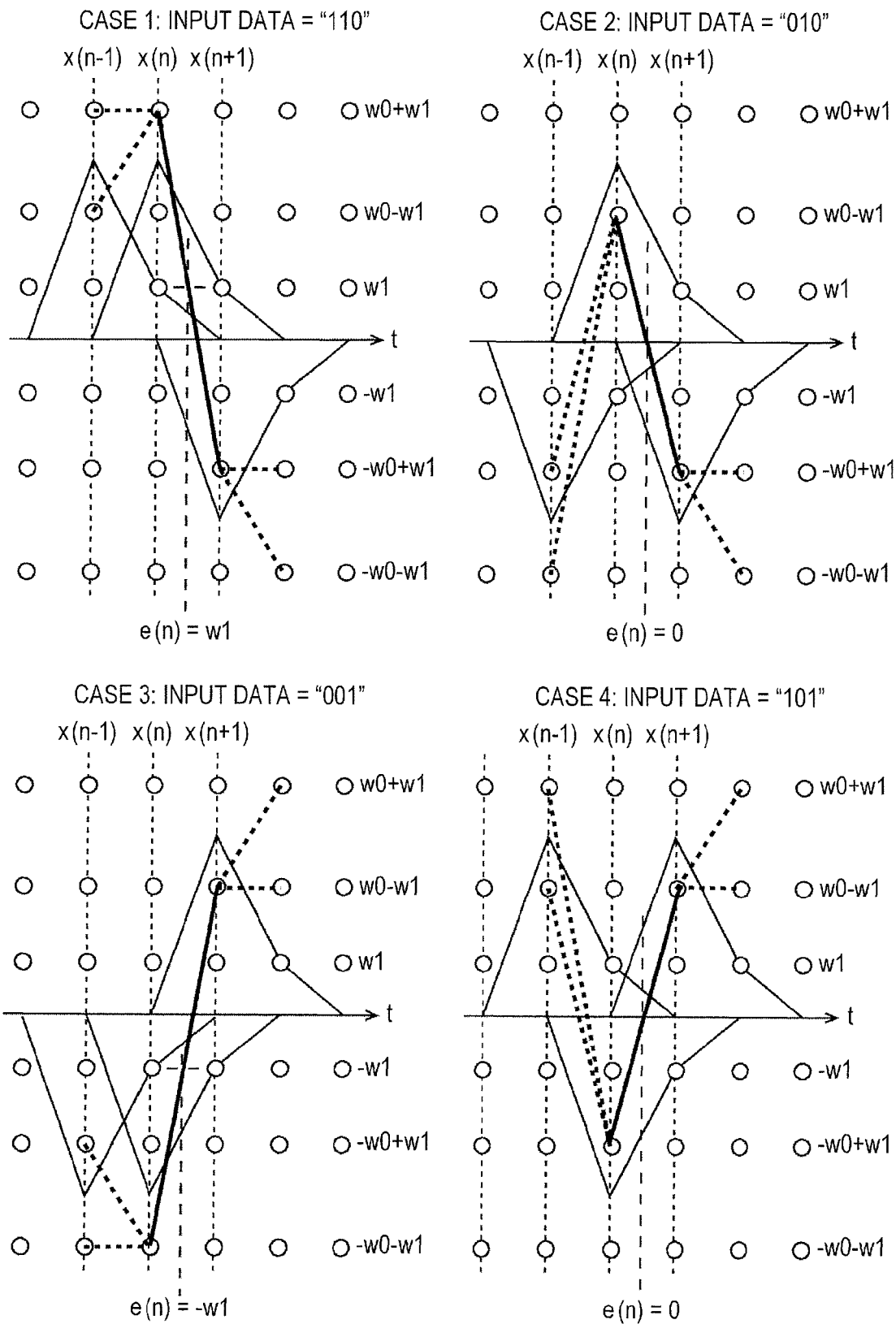
FIG. 11 is a timing chart showing the relationship between the pattern of data values inputted to the semiconductor device according to the first embodiment and an offset to the edge sampling circuit.

Next, the influence of ISI on the edge value sampled at the intermediate time between successive data values will be described. The edge value is influenced by a string of adjacent 3-bit data. More specifically, the influence of ISI on the edge value is classified into four cases by the string of adjacent 3-bit data. FIG. 11 is a timing chart showing the relationship between the pattern of data values inputted to the semiconductor device according to the first embodiment and the offset to the edge sampling circuit.

FIG. 11 shows a data string of 110 as case 1, a data string of 010 as case 2, a data string of 001 as case 3, and a data string of 101 as case 4.

In case 1 of FIG. 11, the data value x(n−1) in the last sampling period is 1, the data value x(n) in the current sampling period is 1, and the data value x(n+1) in the next sampling period is 0. Accordingly, the input signal becomes a waveform shown by a thick line from the signal level w0+w1 of the data value x(n) to be sampled in the current sampling period to the signal level −w0+w1 of the data value x(n+1) to be sampled in the next sampling period. In case 1, the edge value e(n) positioned at the intermediate time between timing t(n) of sampling the data value x(n) and timing t(n+1) of sampling the data value x(n+1) has a signal level of approximately w1 at sampling timing. Therefore, in case 1, by sampling the edge value with the offset of +w1 provided, the edge value e(n) approaches the correct value.

In case 2 of FIG. 11, the data value x(n−1) in the last sampling period is 0, the data value x(n) in the current sampling period is 1, and the data value x(n+1) in the next sampling period is 0. Accordingly, the input signal becomes a waveform shown by a thick line from the signal level w0−w1 of the data value x(n) to be sampled in the current sampling period to the signal level −w0+w1 of the data value x(n+1) to be sampled in the next sampling period. In case 2, the edge value e(n) positioned at the intermediate time between timing t(n) of sampling the data value x(n) and timing t(n+1) of sampling the data value x(n+1) has a signal level of approximately zero at sampling timing. Therefore, in case 2, by sampling the edge value without providing the offset, the edge value e(n) approaches the correct value.

In case 3 of FIG. 11, the data value x(n−1) in the last sampling period is 0, the data value x(n) in the current sampling period is 0, and the data value x(n+1) in the next sampling period is 1. Accordingly, the input signal becomes a waveform shown by a thick line from the signal level −w0−w1 of the data value x(n) to be sampled in the current sampling period to the signal level w0−w1 of the data value x(n+1) to be sampled in the next sampling period. In case 3, the edge value e(n) positioned at the intermediate time between timing t(n) of sampling the data value x(n) and timing t(n+1) of sampling the data value x(n+1) has a signal level of approximately −w1 at sampling timing. Therefore, in case 3, by sampling the edge value with the offset of −w1 provided, the edge value e(n) approaches the correct value.

In case 4 of FIG. 11, the data value x(n−1) in the last sampling period is 1, the data value x(n) in the current sampling period is 0, and the data value x(n+1) in the next sampling period is 1. Accordingly, the input signal becomes a waveform shown by a thick line from the signal level −w0+w1 of the data value x(n) to be sampled in the current sampling period to the signal level w0−w1 of the data value x(n+1) to be sampled in the next sampling period. In case 4, the edge value e(n) positioned at the intermediate time between timing t(n) of sampling the data value x(n) and timing t(n+1) of sampling the data value x(n+1) has a signal level of approximately zero at sampling timing. Therefore, in case 4, by sampling the edge value without providing the offset, the edge value e(n) approaches the correct value.

Figure 12:
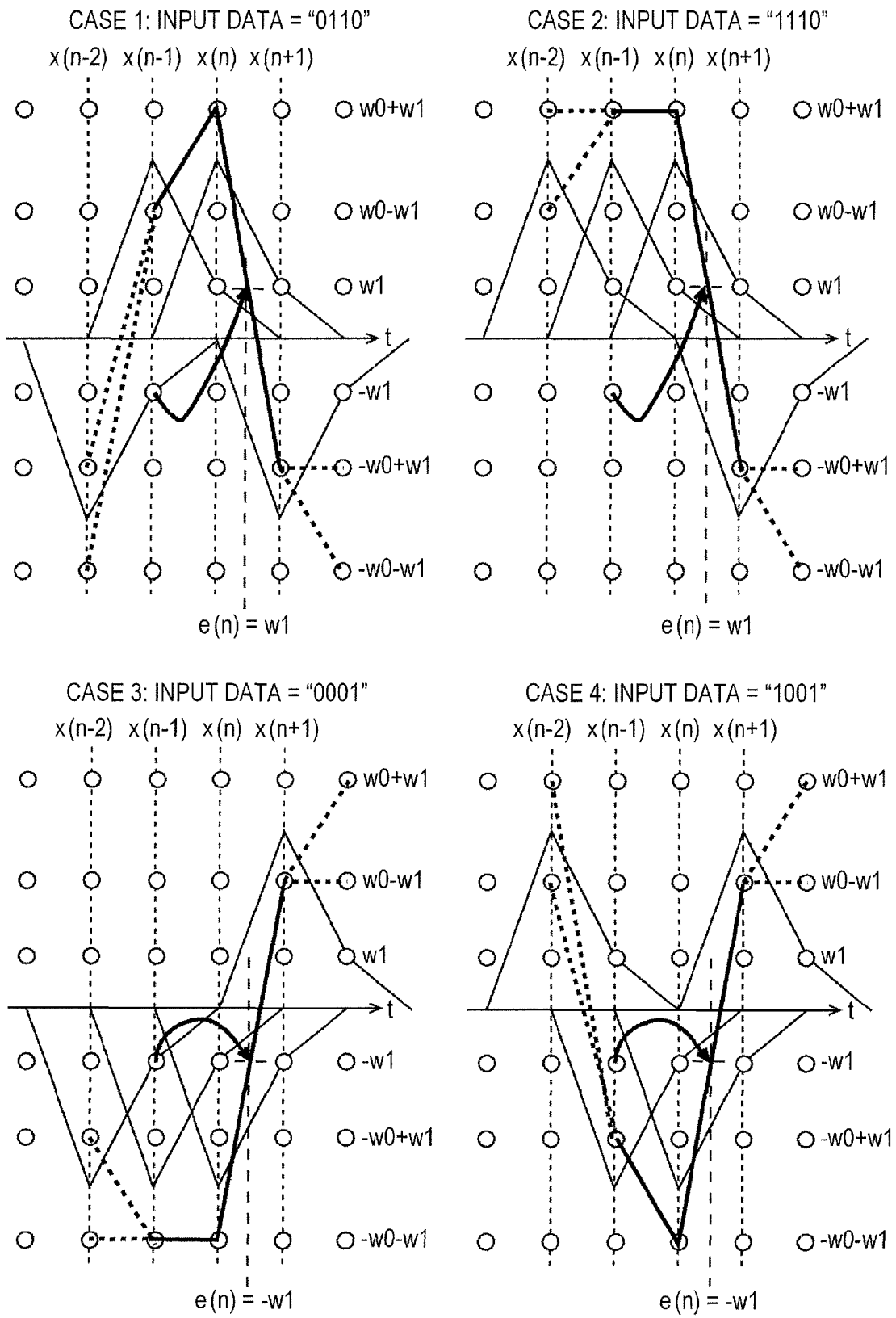
FIG. 12 is a timing chart showing the relationship between the pattern of data values inputted to the semiconductor device according to the first embodiment and the offset to the edge sampling circuit.

As shown in FIG. 11, in the serial communication, the signal level of the input signal Din changes depending on what type of string of data values is inputted. The pattern filter 20 selects one of the edge value sampled with the offset provided and the edge value sampled without providing the offset, in accordance with the temporal change of the data value, thereby outputting the correct edge value. However, in the decision feedback equalizer 10 according to the first embodiment, the data value x(n−1) sampled with the negative offset provided is used to sample the edge value e(n); therefore, it is necessary to determine validity indicating whether or not the edge value ea(n) is correct in the case of the data string of 001 or 110. Hereinafter, a data string pattern in which the edge value ea(n) can be determined to be valid and a data string pattern in which the edge value ea(n) has to be determined to be invalid will be described. FIG. 12 is a timing chart showing the relationship between the pattern of data values inputted to the semiconductor device according to the first embodiment and the offset to the edge sampling circuit.

The validity of the edge value ea(n) in case 1 of FIG. 11 is classified into two cases where the data value before the string of three data values in case 1 of FIG. 11 is 0 and 1. Further, the validity of the edge value ea(n) in case 3 of FIG. 11 is classified into two cases where the data value before the string of three data values in case 3 of FIG. 11 is 0 and 1. FIG. 12 shows four cases. FIG. 12 shows a data string of 0110 as case 1, a data string of 1110 as case 2, a data string of 0001 as case 3, and a data string of 1001 as case 4.

In case 1 of FIG. 12, the data value x(n−2) in the second last sampling period is 0, the data value x(n−1) in the last sampling period is 1, the data value x(n) in the current sampling period is 1, and the data value x(n+1) in the next sampling period is 0. Accordingly, the input signal becomes a waveform shown by a thick line from the signal level w0+w1 of the data value x(n) to be sampled in the current sampling period to the signal level −w0+w1 of the data value x(n+1) to be sampled in the next sampling period. In case 1, the edge value e(n) positioned at the intermediate time between timing t(n) of sampling the data value x(n) and timing t(n+1) of sampling the data value x(n+1) has a signal level of approximately w1 at sampling timing. In case 1, the data value x(n−2) is 0, and the first offset fed back for sampling the edge value e(n) is determined by the data value x(n−1) sampled with the negative offset (e.g., −w1) provided. Since the data value x(n−2) is 0, with the offset of −w1 provided, the data value x(n−1) in case 1 is correctly sampled. Therefore, in case 1, by sampling the edge value with the first offset determined based on the data value x(n−1) provided, the edge value e(n) approaches the correct value.

In case 2 of FIG. 12, the data value x(n−2) in the second last sampling period is 1, the data value x(n−1) in the last sampling period is 1, the data value x(n) in the current sampling period is 1, and the data value x(n+1) in the next sampling period is 0. Accordingly, the input signal becomes a waveform shown by a thick line from the signal level w0+w1 of the data value x(n) to be sampled in the current sampling period to the signal level −w0+w1 of the data value x(n+1) to be sampled in the next sampling period. In case 1, the edge value e(n) positioned at the intermediate time between timing t(n) of sampling the data value x(n) and timing t(n+1) of sampling the data value x(n+1) has a signal level of approximately w1 at sampling timing. In case 2, the data value x(n−2) is 1. Accordingly, in case 2, the signal level of the input signal as the data value x(n−1) becomes w0+w1, which is large enough for the positive offset, so that the data sampler that outputs the data value to be fed back can correctly determine the data value, regardless of whether the offset used for sampling the data value x(n−1) is positive or negative. That is, in case 2, the data value x(n−1) used for generating the first offset is always correct. Therefore, in case 2, by sampling the edge value with the first offset determined based on the data value x(n−1) provided, the edge value e(n) approaches the correct value.

In case 3 of FIG. 12, the data value x(n−2) in the second last sampling period is 0, the data value x(n−1) in the last sampling period is 0, the data value x(n) in the current sampling period is 0, and the data value x(n+1) in the next sampling period is 1. Accordingly, the input signal becomes a waveform shown by a thick line from the signal level −w0−w1 of the data value x(n) to be sampled in the current sampling period to the signal level w0−w1 of the data value x(n+1) to be sampled in the next sampling period. In case 3, the edge value e(n) positioned at the intermediate time between timing t(n) of sampling the data value x(n) and timing t(n+1) of sampling the data value x(n+1) has a signal level of approximately −w1 at sampling timing. In case 3, the data value x(n−2) is 0, and the first offset fed back for sampling the edge value e(n) is determined by the data value x(n−1) sampled with the negative offset (e.g., −w1) provided. Since the data value x(n−2) is 0, with the offset of −w1 provided, the data value x(n−1) in case 3 is correctly sampled. Therefore, in case 3, by sampling the edge value with the first offset determined based on the data value x(n−1) provided, the edge value e(n) approaches the correct value.

In case 4 of FIG. 12, the data value x(n−2) in the second last sampling period is 1, the data value x(n−1) in the last sampling period is 0, the data value x(n) in the current sampling period is 0, and the data value x(n+1) in the next sampling period is 1. Accordingly, the input signal becomes a waveform shown by a thick line from the signal level −w0−w1 of the data value x(n) to be sampled in the current sampling period to the signal level w0−w1 of the data value x(n+1) to be sampled in the next sampling period. In case 4, the edge value e(n) positioned at the intermediate time between timing t(n) of sampling the data value x(n) and timing t(n+1) of sampling the data value x(n+1) has a signal level of approximately −w1 at sampling timing. In case 4, the data value x(n−2) is 1. Accordingly, in case 4, without providing the positive offset (e.g., w1) to the data value x(n−1) to be sampled, the data value x(n−1) becomes an incorrect value. In the decision feedback equalizer 10, the data value x(n−1) sampled with the negative offset (e.g., −w1) provided is fed back. That is, in case 4, the data value x(n−1) used for generating the first offset might be incorrect. Therefore, in case 4, the edge value e(n) sampled using the data value x(n−1) sampled based on the negative offset and fed back as the first offset might be incorrect, and needs to be discarded.

In the data patterns shown in FIG. 12, the edge value e(n) is invalid only if the data string inputted between the second last sampling period and the next sampling period is 1001. Accordingly, if the data string inputted between the second last sampling period and the next sampling period is 1001, the pattern filter 20 causes the validity flag e0valid and the validity flag e1valid to indicate an invalid state (e.g., 0).

As described above, the pattern filter 20 has two functions. The first function is to determine whether to adopt and send to the phase detection circuit 30 the first edge value ea(n) sampled with the first offset provided based on the data value fed back in accordance with the data pattern of data values or the second edge value eb(n) sampled without providing the offset. The second function is to reject the invalid edge value in accordance with the data pattern of data values.

In the first function, the pattern filter 20 selects the second edge value eb(n) if x(n−1)^x(n)=0, and selects the first edge value ea(n) if x(n−1)^x(n)=1, where the symbol "^" denotes an exclusive OR.

In the second function of the pattern filter 20, considering that if x(n)=x(n+1), there exists no edge and the edge value e(n) is invalid, the edge value e(n) is used as an edge under the condition that x(n)^x(n+1)=1 and x(n−2:n+1)!=1001. This condition is expressed as a logical expression, i.e., e(n)valid=x(n)*~x(n+1)+~(x(n−2)*~x(n−1))*~x(n)*x(n+1).
That is, the pattern filter 20 determines the value of the validity flag e(n)valid, based on the condition expressed by this logical expression. In the logical expression, the symbol "~" denotes inverted logic, the symbol "*" denotes a logical AND, and the symbol "+" denotes a logical OR.

In the above description, the signal levels −w1, +w1 assumed as the remaining signal level of the data value in the last sampling period are provided as the first offset used for sampling the edge value. However, this is approximation, and in reality, the offset for sampling the edge value may be a value different from w1, e.g., +we1 or −we1. While this does not apply limitations on the decision feedback equalizer 10, the above description has been made in which w1=we1 for simplicity.

The input waveform as a premise in FIG. 9 has the residual signal level (e.g., w1) correctable by the first tap data of the decision feedback equalizer 10. However, in general, the input waveform further has residual signal levels of w2, w3, and so on which require the second tap data, the third tap data, and so on. The decision feedback equalizer 10 according to the first embodiment is not subject to restrictions even in the case of correction by a plurality of tap data values, and can be applied to one arbitrary tap. In general, the first tap data has the largest amount of correction; accordingly, it is most effective that the configuration of the decision feedback equalizer 10 is applied to the first tap data.

Next, the phase detection circuit 30 of the semiconductor device 1 according to the first embodiment will be described. As described above, the pattern filter 20 outputs the edge value e(n) and the validity flag e(n)valid indicating the validity of the edge value e(n). Accordingly, the phase detection circuit 30 determines the advance or delay of the phase of the sampling clock based on the edge value e(n), and also has the function of not controlling the phase of the sampling clock for the invalid edge value e(n) based on the validity flag e(n)valid.

Figure 13A:
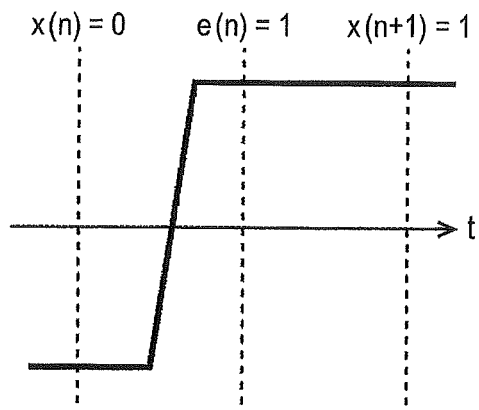
FIGS. 13A and 13B are timing charts each showing the relationship between an edge value outputted in the semiconductor device according to the first embodiment and the phase of the input signal.
Figure 13B:
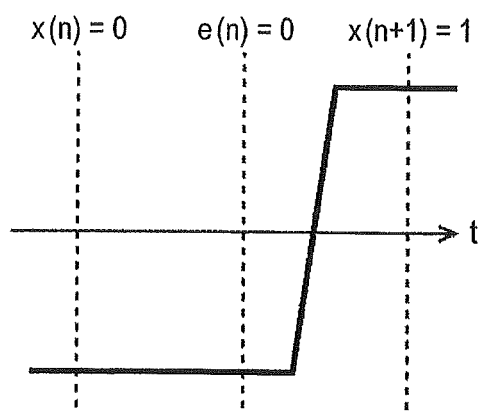

First, the relationship between the edge value sampled by the decision feedback equalizer 10 and the phase of the sampling clock will be described. FIGS. 13A and 13B are timing charts each showing the relationship between the edge value outputted in the semiconductor device according to the first embodiment and the phase of the input signal.

In the left chart of FIG. 13A, the data value x(n) is 0, the edge value e(n) is 1, and the data value x(n+1) is 1. That is, in the left chart of FIG. 13A, the phase of the edge of the input signal Din is advanced from that of the sampling clock. On the other hand, in the right chart of FIG. 13B, the data value x(n) is 0, the edge value e(n) is 0, and the data value x(n+1) is 1. That is, in the right chart of FIG. 13B, the phase of the edge of the input signal Din is delayed from that of the sampling clock.

In the semiconductor device 1 according to the first embodiment, since the edge value e(n) is 0 or 1, if the ratio between 0 and 1 of the edge value e(n) per unit time is about 1:1, it can be determined that the phase of the sampling clock coincides approximately with that of the input signal Din. In the semiconductor device 1, the phase control circuit 40 and the phase shift unit 50 control the phase of the sampling clock so that the ratio between 0 and 1 of the edge value e(n) per unit time becomes about 1:1.

Figure 14:
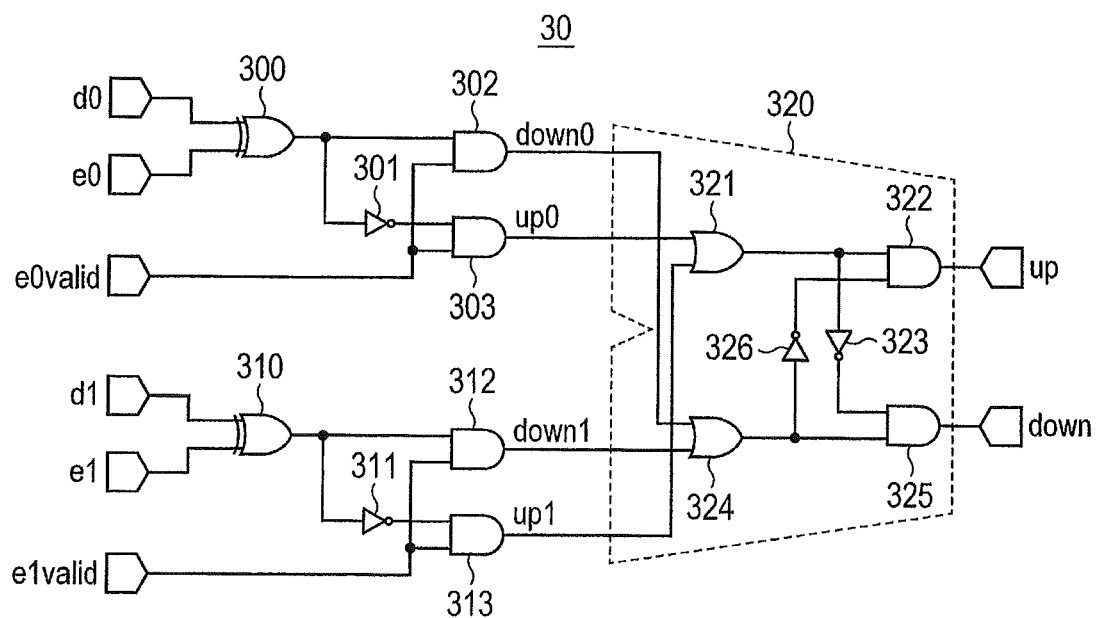
FIG. 14 is a circuit diagram of a phase detection circuit according to the first embodiment.

Next, the configuration of the phase detection circuit 30 will be described. FIG. 14 is a circuit diagram of the phase detection circuit 30 according to the first embodiment. As shown in FIG. 14, the phase detection circuit 30 has EXOR circuits 300, 310, inverters 301, 311, AND circuits 302, 303, 312, 313, and a majority circuit 320.

The odd-numbered data value d0 and the edge value e0 corresponding to the data value d0 are inputted to the EXOR circuit 300. The EXOR circuit 300 outputs the exclusive OR between the two input values.

The output value of the EXOR circuit 300 and the validity flag e0valid indicating the validity of the edge value e0 are inputted to the AND circuit 302. The AND circuit 302 outputs the logical AND between the two input values. The output value' of the AND circuit 302 is a down signal down0 which becomes 1 if the phase of the sampling clock used for sampling the odd-numbered data value is advanced. Further, the down signal down0 becomes 0 if the validity flag e0valid indicates the invalid state (e.g., 0).

A value obtained by inverting by the inverter 301 the output value of the EXOR circuit 300 and the validity flag e0valid indicating the validity of the edge value e0 are inputted to the AND circuit 303. The AND circuit 303 outputs the logical AND between the two input values. The output value of the AND circuit 303 is an up signal up0 which becomes 1 if the phase of the sampling clock used for sampling the odd-numbered data value is delayed. Further, the up signal up0 becomes 0 if the validity flag e0valid indicates the invalid state (e.g., 0).

The even-numbered data value d1 and the edge value e1 corresponding to the data value d1 are inputted to the EXOR circuit 310. The EXOR circuit 310 outputs the exclusive OR between the two input values.

The output value of the EXOR circuit 310 and the validity flag e1valid indicating the validity of the edge value e1 are inputted to the AND circuit 312. The AND circuit 312 outputs the logical AND between the two input values. The output value of the AND circuit 312 is a down signal down1 which becomes 1 if the phase of the sampling clock used for sampling the even-numbered data value is advanced. Further, the down signal down1 becomes 0 if the validity flag e1valid indicates the invalid state (e.g., 0).

A value obtained by inverting by the inverter 311 the output value of the EXOR circuit 310 and the validity flag e1valid indicating the validity of the edge value e1 are inputted to the AND circuit 313. The AND circuit 313 outputs the logical AND between the two input values. The output value of the AND circuit 313 is an up signal up1 which becomes 1 if the phase of the sampling clock used for sampling the even-numbered data value is delayed. Further, the up signal up1 becomes 0 if the validity flag e1valid indicates the invalid state (e.g., 0).

The majority circuit 320 refers to the up signals up0, up1 and the down signals down0, down1, determines which of the up and down signals having a value of 1 is larger in number, and determines the logic levels of the final up signal up and down signal down.

For example, the majority circuit 320 outputs 1 as the up signal up and 0 as the down signal down if both of the up signals up0, up1 are 1. The majority circuit 320 outputs 0 as the up signal up and 1 as the down signal down if both of the down signals down0, down1 are 1. The majority circuit 320 outputs 0 as the up signal up and 0 as the down signal down if either of the up signals up0, up1 is 1 and either of the down signals down0, down1 is 1. The majority circuit 320 outputs 0 as the up signal up and 0 as the down signal down if all of the up signals up0, up1 and the down signals down0, down1 are 0. Further, the majority circuit 320 outputs 1 as the up signal up and 0 as the down signal down if either of the up signals up0, up1 is 1 and both of the down signals down0, down1 are 0. The majority circuit 320 outputs 0 as the up signal up and 1 as the down signal down if both of the up signals up0, up1 are 0 and either of the down signals down0, down1 is 1. The majority circuit 320 includes OR circuits 321, 324, AND circuits 322, 325, and inverters 323, 326 to perform the above operation.

The up signals up0, up1 are inputted to the OR circuit 321. The OR circuit 321 outputs the logical OR between the two input signals. The down signals down0, down1 are inputted to the OR circuit 324. The OR circuit 324 outputs the logical OR between the two input signals.

The output value of the OR circuit 321 and a value obtained by inverting by the inverter 326 the output value of the OR circuit 324 are inputted to the AND circuit 322. The AND circuit 322 outputs the logical AND between the two input signals, as the up signal up. The output value of the OR circuit 324 and a value obtained by inverting by the inverter 323 the output value of the OR circuit 321 are inputted to the AND circuit 325. The AND circuit 325 outputs the logical AND between the two input signals, as the down signal down.

As described above, the semiconductor device 1 according to the first embodiment has the decision feedback equalizer 10 as one of the features, which reduces the circuit area and the power consumption. More specifically, in the decision feedback equalizer 10, by using the first data sampling circuit which samples the data value, using the negative offset (e.g., −w1) and the second data sampling circuit which samples the data value, using the positive offset (e.g., w1), the first tap data is loop-unrolled. Further, the output value of the data sampler of the first data sampling circuit is directly fed back to the mixer provided at the input of the edge sampling circuit, without passing through the selector. That is, in the decision feedback equalizer 10, logic in the feedback path to the edge sampling circuit is simplified.

Generally, in the case of loop-unrolling the first tap data, since the sampled data value is determined by being outputted as the output value of the selector, the data value outputted from the selector is fed back to the edge sampling circuit, as shown in FIG. 2. However, this tightens the timing restriction on the feedback path as shown in FIG. 4, which disadvantageously increases the power consumption of CTS buffers etc.

On the other hand, in the decision feedback equalizer 10 according to the first embodiment, the logic in the feedback path is simplified, which can ease the timing restriction on the feedback path, in comparison with the decision feedback equalizer 10a shown in FIG. 2. Further, in the decision feedback equalizer 10 according to the first embodiment, by easing the timing restriction on the feedback path, it becomes possible to reduce the number of or the capability of CTS buffers, which can reduce the circuit area and the power consumption.

Further, as another circuit configuration of the decision feedback equalizer 10, the first and second sampling circuits each can include three edge sampling circuits having the positive offset (+w1), the negative offset (−w1), and zero without feedback, and the subsequent circuit such as the pattern filter selects the edge value. However, this increases the number of edge sampling circuits. The increased number of edge sampling circuits increases loads on the pipeline in the subsequent stage and the amplifier in the preceding stage, which disadvantageously increases the power consumption. Further, the increased number of edge sampling circuits disadvantageously increases the circuit area. However, in the decision feedback equalizer 10 according to the first embodiment, the first and second sampling circuits each include only the two edge sampling circuits, which can reduce the circuit area of the edge sampling circuit and the power consumption.

Further, in the decision feedback equalizer 10 according to the first embodiment, the data value sampled using the negative offset in the last sampling period is used as the data value fed back to the edge sampling circuit. By configuring such a feedback path in the decision feedback equalizer 10 according to the first embodiment, the data string pattern of the invalid edge value e(n) is only 1001, which can reflect the edge value e(n) in the phase control of the sampling clock with a high probability. This enables high phase tracking ability in the semiconductor device 1 according to the first embodiment as a CDR (clock and data recovery) circuit.

For example, in the technique described in Non-patent Document 1, only several data patterns can be adopted as the valid edge value e(n); accordingly, the phase tracking ability of the CDR circuit is inferior compared to the semiconductor device 1 according to the first embodiment.

Further, for example, the data value of the second data sampling circuit which samples data using the positive offset can be fed back to the edge sampling circuit. However, in this case, the valid edge value e(n) cannot be acquired in the case where the data pattern is 001. That is, the circuit for feeding back the data value of the second data sampling circuit disadvantageously increases the probability of occurrence of the invalid edge value e(n), in comparison with the semiconductor device 1 according to the first embodiment which can acquire the valid edge value e(n) in the case where the data pattern is 0001. Assuming that the data pattern is inputted in a random manner; by acquiring 0001 as the valid edge value, it is possible to reduce the probability of occurrence of the invalid edge value to half, in comparison with the case where the data string of 001 is all the invalid edge value.

Further, in the bang-bang CDR, several-adjacent-bit edge values e(n) (mostly 4 to 8 bits) are generally decimated in phase comparison. For example, in 4-bit decimation, first, two-adjacent-bit edge values undergo majority processing for 2:1 decimation for 1-bit output, and then the decimated edge values undergo majority processing for 2:1 decimation, thus finally leading to 4:1 decimation by tournament. Alternatively, four adjacent bits undergo majority processing. In either case, in 4:1 decimation, even if the edge value e(n) sampled in the input pattern of 1001 is discarded, edge value e(n−2) is valid, which exerts little influence on the phase tracking ability of the CDR circuit. That is, the semiconductor device 1 according to the first embodiment can extremely decrease the probability of occurrence of the invalid edge value e(n), which makes it possible to ensure the high phase tracking ability of the CDR circuit.

Second Embodiment

In the second embodiment, description will be made on a decision feedback equalizer 11 having a different configuration from that of the decision feedback equalizer 10 according to the first embodiment. In the description of the second embodiment, components described in the first embodiment are denoted by the same reference numerals as in the first embodiment, and description thereof is omitted.

Figure 15:
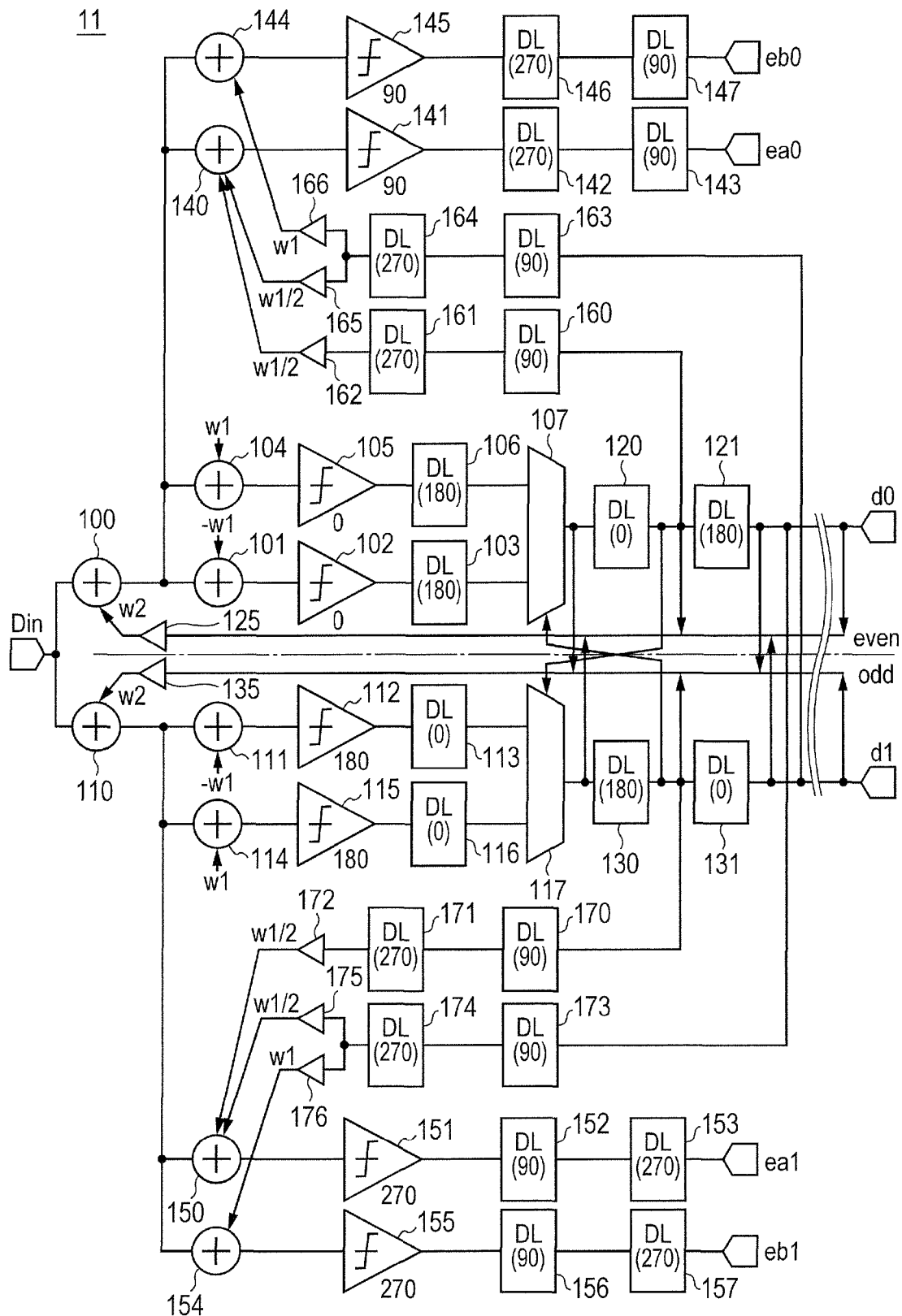
FIG. 15 is a circuit diagram of a sampling circuit according to a second embodiment.

FIG. 15 is a circuit diagram of the decision feedback equalizer 11 according to the second embodiment. In FIG. 15, the D latch circuits 122 to 124 of the shift register configured with the D latch circuits 120 to 124 and the D latch circuits 132 to 134 of the shift register configured with the D latch circuits 130 to 134 are not shown. As shown in FIG. 15, the logic in the feedback path to the edge sampling circuit in the decision feedback equalizer 11 differs from that of the decision feedback equalizer 10.

More specifically, the decision feedback equalizer 11 according to the second embodiment determines the first offset to the first edge sampling circuit of one sampling circuit in the current sampling period, based on the data value sampled in the second last sampling period and the data value sampled in the third last sampling period. Further, the decision feedback equalizer 11 according to the second embodiment determines the second offset to the second edge sampling circuit of one sampling circuit in the current sampling period, based on the data value sampled in the third last sampling period.

As shown in FIG. 15, the decision feedback equalizer 11 is configured by deleting the buffer circuits 108, 118 from the decision feedback equalizer 10 and adding D latch circuits 160, 161, 163, 164, 170, 171, 173, 174 and buffer circuits 162, 165, 166, 172, 175, 176.

The D latch circuits 160, 161 and the buffer circuit 162 configure a feedback path for feeding back to the mixer 140 the second tap data outputted from the D latch circuit 120, as the first offset. The D latch circuit 160 operates based on the sampling clock SMCLK (90). The D latch circuit 161 operates based on the sampling clock SMCLK (270). The buffer circuit 162 provides the offset of w1/2 to the mixer 140, based on the second tap data.

The D latch circuits 163, 164 and the buffer circuit 165 configure a feedback path for feeding back to the mixer 140 the third tap data outputted from the D latch circuit 131, as the first offset. Further, the D latch circuits 163, 164 and the buffer circuit 166 configure a feedback path for feeding back to the mixer 144 the third tap data outputted from the D latch circuit 131, as the second offset. The D latch circuit 163 operates based on the sampling clock SMCLK (90). The D latch circuit 164 operates based on the sampling clock SMCLK (270). The buffer circuit 165 provides the offset of w1/2 to the mixer 140, based on the third tap data. The buffer circuit 166 provides the offset of w1 to the mixer 144, based on the third tap data.

The D latch circuits 170, 171 and the buffer circuit 172 configure a feedback path for feeding back to the mixer 150 the second tap data outputted from the D latch circuit 130, as the first offset. The D latch circuit 170 operates based on the sampling clock SMCLK (90). The D latch circuit 171 operates based on the sampling clock SMCLK (270). The buffer circuit 172 provides the offset of w1/2 to the mixer 150, based on the second tap data.

The D latch circuits 173, 174 and the buffer circuit 175 configure a feedback path for feeding back to the mixer 150 the third tap data outputted from the D latch circuit 121, as the first offset. Further, the D latch circuits 173, 174 and the buffer circuit 176 configure a feedback path for feeding back to the mixer 154 the third tap data outputted from the D latch circuit 121, as the second offset. The D latch circuit 173 operates based on the sampling clock SMCLK (90). The D latch circuit 174 operates based on the sampling clock SMCLK (270). The buffer circuit 175 provides the offset of w1/2 to the mixer 150, based on the third tap data. The buffer circuit 176 provides the offset of w1 to the mixer 154, based on the third tap data.

Figure 16:
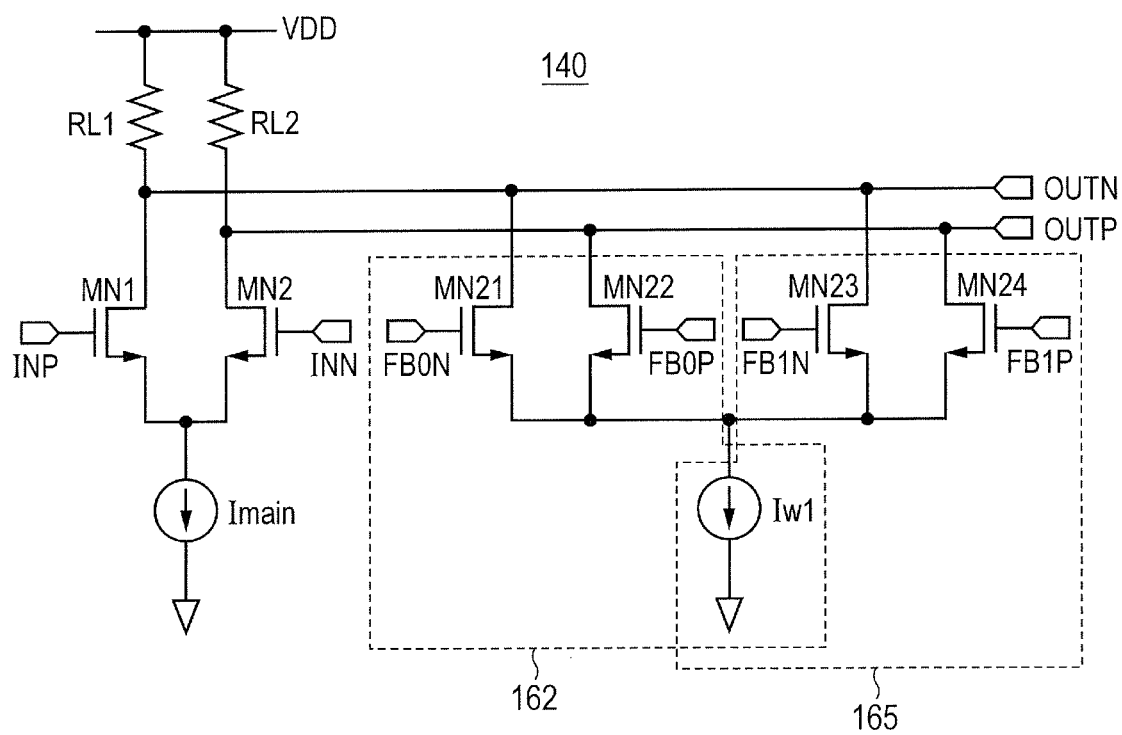
FIG. 16 is a circuit diagram of a mixer according to the second embodiment.

In the decision feedback equalizer 11 according to the second embodiment, two pieces of w1/2 as the offset generated based on the tap data are provided to the mixers 140, 150. FIG. 16 is a circuit diagram of the mixer 140 according to the second embodiment. The circuit including the mixer 144 and the buffer circuit 166 and the circuit including the mixer 154 and the buffer circuit 176 in the decision feedback equalizer 11 are substantially the same as the mixer 140 shown in FIG. 7; therefore, description thereof is omitted.

In the circuit diagram shown in FIG. 16, the buffer circuits 162, 165 are shown as circuits for providing the offset to the mixer 140 according to the second embodiment. The mixer 140 has NMOS transistors MN1, MN2, load resistors RL1, RL2, and a current source. The buffer circuits 162, 165 have a current source in common. The buffer circuit 162 has a differential pair configured with NMOS transistors MN21, MN22. The buffer circuit 165 has a differential pair configured with NMOS transistors MN23, MN24.

The NMOS transistors MN1, MN2 configure a differential pair. A positive signal INP of the input signal Din is provided to the gate of the NMOS transistor MN1. A negative signal INN of the input signal Din is provided to the gate of the NMOS transistor MN2. The current source supplies a current Imain to the differential pair. Further, the load resistor RL1 is coupled between the drain of the NMOS transistor MN1 and a power line to which a power supply voltage VDD is supplied. The load resistor RL2 is coupled between the drain of the NMOS transistor MN2 and the power line to which the power supply voltage VDD is supplied. Further, a first output terminal OUTN is coupled to the drain of the NMOS transistor MN1 through a first output line. A second output terminal OUTP is coupled to the drain of the NMOS transistor MN2 through a second output line.

Next, the buffer circuit 162 will be described. A negative signal FB0N of differential signals provided as the data value outputted from the D latch circuit 161 is provided to the gate of the NMOS transistor MN21. A positive signal FB0P of the differential signals provided as the data value outputted from the D latch circuit 161 is provided to the gate of the NMOS transistor MN22. Further, the drain of the NMOS transistor MN21 is coupled to the first output line. The drain of the NMOS transistor MN22 is coupled to the second output line.

Next, the buffer circuit 165 will be described. A negative signal FB1N of differential signals provided as the data value outputted from the D latch circuit 164 is provided to the gate of the NMOS transistor MN23. A positive signal FB1P of the differential signals provided as the data value outputted from the D latch circuit 164 is provided to the gate of the NMOS transistor MN24. Further, the drain of the NMOS transistor MN23 is coupled to the first output line. The drain of the NMOS transistor MN24 is coupled to the second output line.

The current source supplies a current Iw1 to the differential pair of the buffer circuit 162 and the differential pair of the buffer circuit 165. That is, in the decision feedback equalizer 11, a current of Iw1/2 is supplied to the buffer circuit 162, and a current of Iw1/2 is supplied to the buffer circuit 165.

The mixer 140 selects whether to pass the current Imain of the current source through the load resistor RL1 or the load resistor RL2 in accordance with the level of the input signal Din, thereby switching the logic level of the output of the mixer 140. Further, the buffer circuits 162, 165 each select whether to pass the current Iw1/2 to the load resistor RL1 or the load resistor RL2 in accordance with the logic level of the data value. That is, the buffer circuits 162, 165 each pass the current Iw1/2 to the first output line and the second output line, thereby providing the offset to the signal level of the mixer 140.

Next, the operation of the decision feedback equalizer 11 according to the second embodiment will be described. The sampling of the data value in the decision feedback equalizer 11 is the same as in the decision feedback equalizer 10 according to the first embodiment; therefore, description thereof is omitted. On the other hand, the sampling of the edge value in the decision feedback equalizer 11 is different from that of the decision feedback equalizer 10 according to the first embodiment in terms of the feedback data value. Hereinafter, the sampling of the edge value in the decision feedback equalizer 11 according to the second embodiment will be described.

Figure 17:
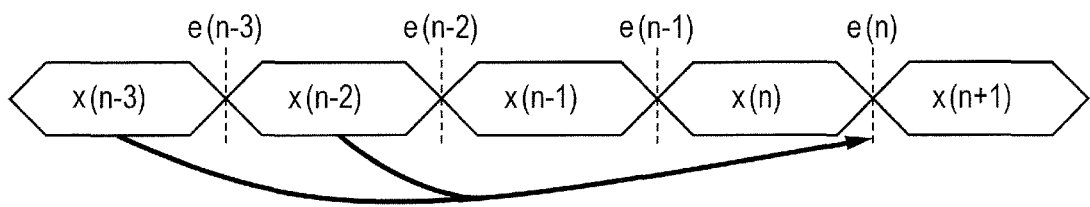
FIG. 17 is a diagram showing the relationship between the pattern of the second and third tap data and offsets to edge sampling circuits in a semiconductor device according to the second embodiment.

FIG. 17 is a diagram showing the relationship between the pattern of the second and third tap data and the offsets to the edge sampling circuits in the semiconductor device according to the second embodiment. As shown in FIG. 17, in the decision feedback equalizer 11 according to the second embodiment, the offset used for sampling the edge value e(n) is determined based on the second tap data (hereinafter referred to as the data value x(n−2)) determined in the second last sampling period and the third tap data (hereinafter referred to as the data value x(n−3)) determined in the third last sampling period. More specifically, the relationship between the combination of the data value x(n−3) and the data value x(n−2) and the first edge value ea(n) and the second edge value eb(n) expected for each combination is shown in a table in the lower part of FIG. 17.

More specifically, if the data value x(n−3) is 0 and the data value x(n−2) is 0, the first offset used for sampling the first edge value ea(n) is −w1 and the second offset used for sampling the second edge value eb(n) is +w1. If the data value x(n−3) is 1 and the data value x(n−2) is 0, the first offset used for sampling the first edge value ea(n) is 0 and the second offset used for sampling the second edge value eb(n) is −w1. If the data value x(n−3) is 0 and the data value x(n−2) is 1, the first offset used for sampling the first edge value ea(n) is 0 and the second offset used for sampling the second edge value eb(n) is +w1. If the data value x(n−3) is 1 and the data value x(n−2) is 1, the first offset used for sampling the first edge value ea(n) is +w1 and the second offset used for sampling the second edge value eb(n) is −w1.

As described with reference to FIGS. 11 and 12, in the signal waveform of the input signal Din, the offset used for sampling the edge value needs to be changed in accordance with the levels of the data values in the last and next sampling periods. FIG. 18 is a table showing the relationship between the pattern of data values inputted to the semiconductor device according to the second embodiment and the offsets to the edge sampling circuits.

FIG. 18 shows 16 cases. In cases 1 to 4, the combination of the data value x(n−1) in the last sampling period, the data value x(n) in the current sampling period, and the data value x(n+1) in the next sampling period is 001 in four patterns obtained by the combination of the data value x(n−3) and the data value x(n−2). In cases 5 to 8, the combination of the data value x(n−1) in the last sampling period, the data value x(n) in the current sampling period, and the data value x(n+1) in the next sampling period is 101 in the four patterns obtained by the combination of the data value x(n−3) and the data value x(n−2). In cases 9 to 12, the combination of the data value x(n−1) in the last sampling period, the data value x(n) in the current sampling period, and the data value x(n+1) in the next sampling period is 010 in the four patterns obtained by the combination of the data value x(n−3) and the data value x(n−2). In cases 13 to 16, the combination of the data value x(n−1) in the last sampling period, the data value x(n) in the current sampling period, and the data value x(n+1) in the next sampling period is 110 in the four patterns obtained by the combination of the data value x(n−3) and the data value x(n−2).

First, in cases 1 to 4, since the pattern of the three later-inputted data values is 001, an expected offset value is −w1. On the other hand, based on the data value x(n−3) and the data value x(n−2), the offset is determined to be −w1 in cases 1, 2, 4. That is, by selecting the edge value ea(n) in case 1 where the combination of the data value x(n−3) and the data value x(n−2) is 00, the semiconductor device 1 can acquire the valid edge value e(n). By selecting the edge value eb(n) in case 2 where the combination of the data value x(n−3) and the data value x(n−2) is 10, the semiconductor device 1 can acquire the valid edge value e(n). By selecting the edge value eb(n) in case 4 where the combination of the data value x(n−3) and the data value x(n−2) is 11, the semiconductor device 1 can acquire the valid edge value e(n). On the other hand, in case 3 where the combination of the data value x(n−3) and the data value x(n−2) is 01, since there is no edge sampling circuit for outputting the edge value with the offset of −w1, the semiconductor device 1 cannot acquire the valid edge value e(n).

In cases 5 to 8, since the pattern of the three later-inputted data values is 101, an expected offset value is 0. On the other hand, based on the data value x(n−3) and the data value x(n−2), the offset is determined to be 0 in cases 6, 7. That is, by selecting the edge value ea(n) in case 6 where the combination of the data value x(n−3) and the data value x(n−2) is 10, the semiconductor device 1 can acquire the valid edge value e(n). By selecting the edge value ea(n) in case 7 where the combination of the data value x(n−3) and the data value x(n−2) is 01, the semiconductor device 1 can acquire the valid edge value e(n). On the other hand, in case 5 where the combination of the data value x(n−3) and the data value x(n−2) is 00 and in case 8 where the combination of the data value x(n−3) and the data value x(n−2) is 11, since there is no edge sampling circuit for outputting the edge value with the offset of 0, the semiconductor device 1 cannot acquire the valid edge value e(n).

In cases 9 to 12, since the pattern of the three later-inputted data values is 010, an expected offset value is 0. On the other hand, based on the data value x(n−3) and the data value x(n−2), the offset is determined to be 0 in cases 10, 11. That is, by selecting the edge value ea(n) in case 10 where the combination of the data value x(n−3) and the data value x(n−2) is 10, the semiconductor device 1 can acquire the valid edge value e(n). By selecting the edge value ea(n) in case 11 where the combination of the data value x(n−3) and the data value x(n−2) is 01, the semiconductor device 1 can acquire the valid edge value e(n). On the other hand, in case 9 where the combination of the data value x(n−3) and the data value x(n−2) is 00 and in case 11 where the combination of the data value x(n−3) and the data value x(n−2) is 11, since there is no edge sampling circuit for outputting the edge value with the offset of 0, the semiconductor device 1 cannot acquire the valid edge value e(n).

In cases 13 to 16, since the pattern of the three later-inputted data values is 110, an expected offset value is +w1. On the other hand, based on the data value x(n−3) and the data value x(n−2), the offset is determined to be +w1 in cases 13, 15, 16. That is, by selecting the edge value eb(n) in case 13 where the combination of the data value x(n−3) and the data value x(n−2) is 00, the semiconductor device 1 can acquire the valid edge value e(n). By selecting the edge value eb(n) in case 15 where the combination of the data value x(n−3) and the data value x(n−2) is 01, the semiconductor device 1 can acquire the valid edge value e(n). By selecting the edge value ea(n) in case 16 where the combination of the data value x(n−3) and the data value x(n−2) is 11, the semiconductor device 1 can acquire the valid edge value e(n). On the other hand, in case 14 where the combination of the data value x(n−3) and the data value x(n−2) is 10, since there is no edge sampling circuit for outputting the edge value with the offset of +w1, the semiconductor device 1 cannot acquire the valid edge value e(n).

Based on the table shown in FIG. 18, the validity flag e(n)valid of the pattern filter 20 according to the second embodiment is expressed by the following logical expression (1).

$$e(n) \text{ valid} = \\ (\sim B * \sim C + \sim (A \wedge B \wedge C)) * \sim D * E + (B * C + A \wedge B \wedge C) * D * \sim E \quad (1)$$

where A denotes the data value x(n−3), B denotes the data value x(n−2), C denotes the data value x(n−1), and D denotes the data value x(n), and E denotes the data value x(n+1).

Further, based on the table shown in FIG. 18, the selection signal e_sel(n) of the pattern filter 20 according to the second embodiment is expressed by the following logical expression (2).

$$e\_sel(n) = A * \sim C * \sim \sim D + \sim A * C * D \quad (2)$$

where A to E denote the data values x(n−3) to x(n+1) respectively as in expression (1).

By configuring logic circuits of the edge validity determination circuits 209, 216 based on expressions (1) and (2), the semiconductor device 1 according to the second embodiment can acquire the valid edge value in 10 of 16 input data patterns. FIG. 19 is a table showing the patterns of data values that enable the sampling of the valid edge value in the semiconductor device according to the second embodiment. In the table shown in FIG. 19, the symbol "X" signifies that the data value can take any of the values 0 and 1. The table shown in FIG. 19 is created by summarizing the input data patterns that enable the acquisition of the valid edge value in FIG. 18.

In input data patterns that are not included in FIG. 19, the valid edge value e(n) cannot be acquired, which might degrade the phase tracking ability of the CDR circuit. However, if a valid edge value exists at timing temporally close to the invalid edge value, an influence on the phase tracking ability of the CDR is almost negligible. Hereinafter, timing at which the valid edge value can be acquired in the data patterns not included in FIG. 19 will be examined. FIG. 20 is a table for explaining a data string closest to the edge value e(n) among data strings that enable the acquisition of the valid edge value.

As shown in FIG. 20, even in cases 3, 5, 8 where it is determined that the edge value cannot be correctly sampled in the table of FIG. 19; by adding data before 3 UI, a valid edge value can be acquired within 4 UI before the edge value e(n) to be acquired. Further, in cases 9, 12, 14, it is determined that the edge value cannot be correctly sampled in FIG. 19. However, cases 9, 12, 14 are the inversion of cases 8, 5, 3; therefore, the valid edge value can be acquired within 4 UI as in cases 8; 5, 3.

Thus, in the semiconductor device 1 according to the second embodiment, although the number of input data patterns in which the invalid edge value e(n) is sampled is larger than that of the first embodiment, the valid edge value can be detected within a temporally close range of the invalid edge value e(n). Therefore, in the semiconductor device 1 according to the second embodiment, it is possible to maintain the phase tracking ability of the CDR circuit as in the first embodiment.

As described above, the decision feedback equalizer 11 according to the second embodiment generates the first offset and the second offset provided to the edge sampling circuits, based on the second tap data and the third tap data. Accordingly, the decision feedback equalizer 11 according to the second embodiment can ease the timing restriction on the feedback path, in comparison with the decision feedback equalizer 10 according to the first embodiment.

Further, in the semiconductor device 1 including the decision feedback equalizer 11 according to the second embodiment, the number of input data patterns that enable the acquisition of the valid edge value is smaller than that of the semiconductor device 1 according to the first embodiment. However, the valid edge value can be acquired within the temporally close range (e.g., 4 UI) of the invalid edge value e(n). Therefore, in the semiconductor device 1 according to the second embodiment, it is possible to ensure phase tracking ability equivalent to that of the semiconductor device 1 according to the first embodiment.

Further, in the semiconductor device 1 according to the second embodiment, the pattern filter 20 configured with a different logic circuit from that of the first embodiment is used, which increases the circuit area of the pattern filter 20. However, in the decision feedback equalizer 11 according to the second embodiment, the timing restriction on the feedback path is eased, which decreases the circuit area and consumption current in the feedback path of the decision feedback equalizer 11. The advantage of decreasing the circuit area and power consumption of the decision feedback equalizer 11 surpasses the disadvantage of increasing the circuit area of the pattern filter 20.

Third Embodiment

In the third embodiment, description will be made on a decision feedback equalizer 12 having a different configuration from that of the decision feedback equalizer 10 according to the first embodiment. In the description of the third embodiment, components described in the first embodiment are denoted by the same reference numerals as in the first embodiment, and description thereof is omitted.

Figure 21:
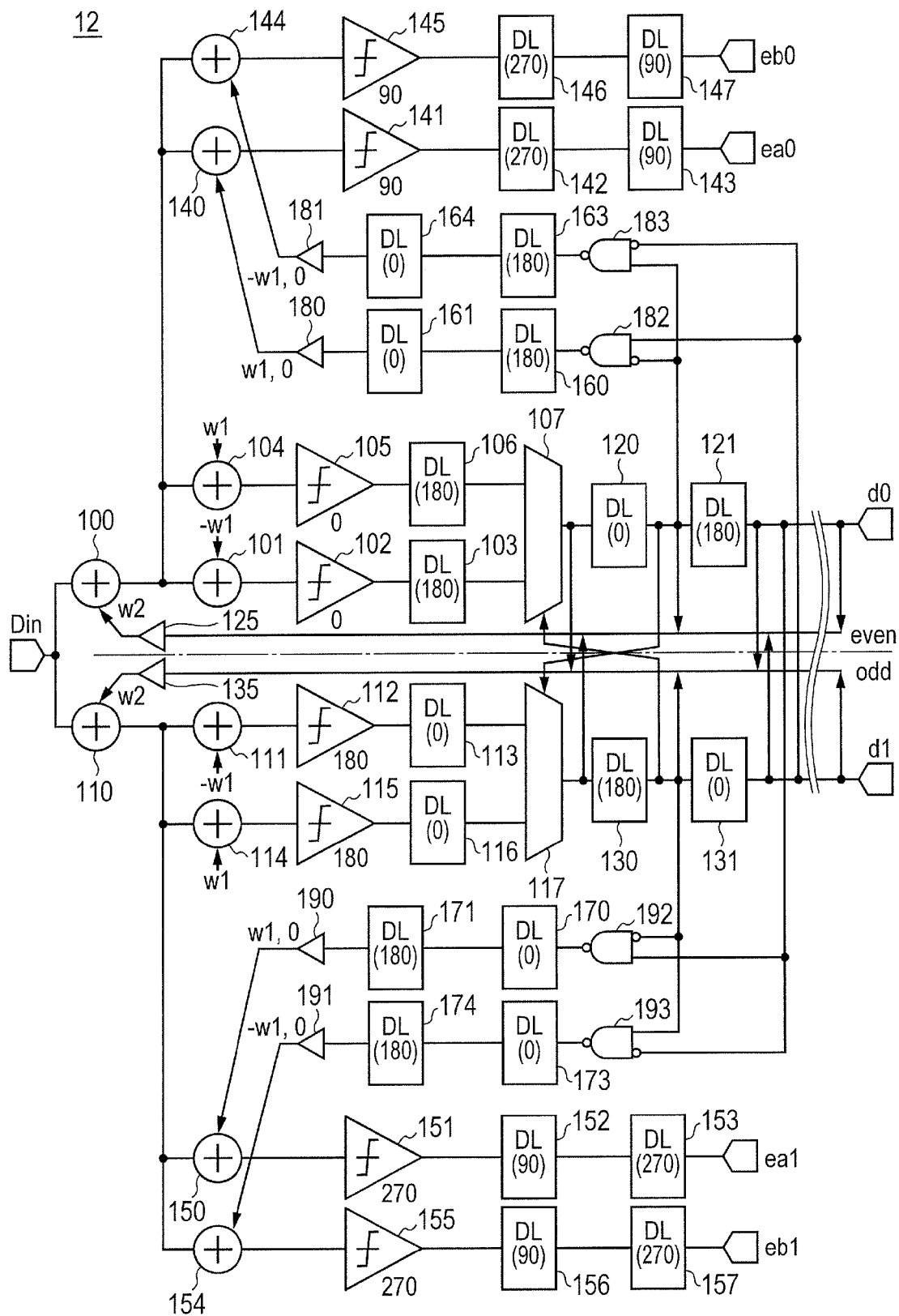
FIG. 21 is a circuit diagram of a sampling circuit according to a third embodiment.

FIG. 21 is a circuit diagram of the decision feedback equalizer 12 according to the third embodiment. In FIG. 21, the D latch circuits 122 to 124 of the shift register configured with the D latch circuits 120 to 124 and the D latch circuits 132 to 134 of the shift register configured with the D latch circuits 130 to 134 are not shown. As shown in FIG. 21, the logic in the feedback path to the edge sampling circuit in the decision feedback equalizer 12 differs from that of the decision feedback equalizer 10.

More specifically, the decision feedback equalizer 12 according to the third embodiment determines the first offset and the second offset to one sampling circuit in the current sampling period, based on the data value sampled in the second last sampling period and the data value sampled in the third last sampling period.

As shown in FIG. 21, the decision feedback equalizer 12 is configured by deleting the buffer circuits 108, 118 from the decision feedback equalizer 10 and adding D latch circuits 160, 161, 163, 164, 170, 171, 173, 174, buffer circuits 180, 181, 190, 191, and NAND circuits 182, 183, 192, 193.

The D latch circuits 160, 161, the buffer circuit 180, and the NAND circuit 182 configure a feedback path for feeding back to the mixer 140 the second tap data outputted from the D latch circuit 120 and the third tap data outputted from the D latch circuit 131, as the first offset. The NAND circuit 182 provides the inverted AND between the inverted value of the second tap data and the third tap data to the D latch circuit 160. The D latch circuit 160 operates based on the sampling clock SMCLK (90). The D latch circuit 161 operates based on the sampling clock SMCLK (270). The buffer circuit 180 provides to the mixer 140 the first offset of w1 or 0 based on the output value of the NAND circuit 182.

The D latch circuits 163, 164, the buffer circuit 181, and the NAND circuit 183 configure a feedback path for feeding back to the mixer 144, the second tap data outputted from the D latch circuit 120 and the third tap data outputted from the D latch circuit 131, as the second offset. The NAND circuit 183 provides the inverted AND between the inverted value of the third tap data and the second tap data to the D latch circuit 163. The D latch circuit 163 operates based on the sampling clock SMCLK (90). The D latch circuit 164 operates based on the sampling clock SMCLK (270). The buffer circuit 181 provides to the mixer 144 the second offset of −w1 or 0 based on the output value of the NAND circuit 183.

The D latch circuits 170, 171, the buffer circuit 190, and the NAND circuit 192 configure a feedback path for feeding back to the mixer 150 the second tap data outputted from the D latch circuit 130 and the third tap data outputted from the D latch circuit 121, as the first offset. The NAND circuit 192 provides the inverted AND between the inverted value of the second tap data and the third tap data to the D latch circuit 170. The D latch circuit 170 operates based on the sampling clock SMCLK (90). The D latch circuit 171 operates based on the sampling clock SMCLK (270). The buffer circuit 190 provides to the mixer 150 the first offset of w1 or 0 based on the output value of the NAND circuit 192.

The D latch circuits 173, 174, the buffer circuit 191, and the NAND circuit 193 configure a feedback path for feeding back to the mixer 154 the second tap data outputted from the D latch circuit 130 and the third tap data outputted from the D latch circuit 121, as the second offset. The NAND circuit 193 provides the inverted AND between the inverted value of the third tap data and the second tap data to the D latch circuit 173. The D latch circuit 173 operates based on the sampling clock SMCLK (90). The D latch circuit 174 operates based on the sampling clock SMCLK (270). The buffer circuit 191 provides to the mixer 154 the second offset of −w1 or 0 based on the output value of the NAND circuit 193.

Figures 22, 23:
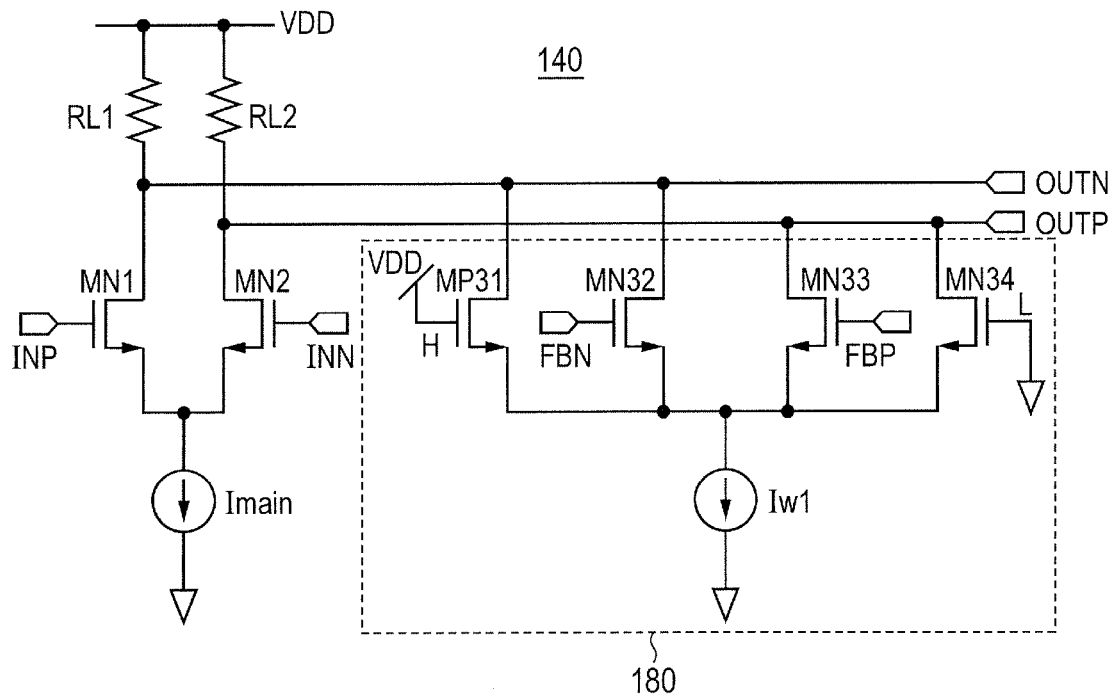
FIG. 22 is a circuit diagram of a mixer according to the third embodiment.
FIG. 23 is a table showing the relationship between the pattern of the second and third tap data and offsets to edge sampling circuits in a semiconductor device according to the third embodiment.

In the decision feedback equalizer 12 according to the third embodiment, w1 or 0 as the offset generated based on the tap data is provided to the mixers 140, 150, and −w1 or 0 as the offset generated based on the tap data is provided to the mixers 144, 154. FIG. 22 is a circuit diagram of the mixer 140 according to the third embodiment. The mixers 144, 150, 154 in the decision feedback equalizer 12 are substantially the same as the mixer 140; therefore, description thereof is omitted.

In the circuit diagram shown in FIG. 22, the buffer circuit 180 is shown as a circuit for providing the offset to the mixer 140 according to the third embodiment. The mixer 140 has NMOS transistors MN1, MN2, load resistors RL1, RL2, and a current source. Further, the buffer circuit 180 has NMOS transistors MN32, MN33, MN31, MN34 and a current source.

The NMOS transistors MN1, MN2 configure a differential pair. A positive signal INP of the input signal Din is provided to the gate of the NMOS transistor MN1. A negative signal INN of the input signal Din is provided to the gate of the NMOS transistor MN2. The current source supplies a current Imain to the differential pair. Further, the load resistor RL1 is coupled between the drain of the NMOS transistor MN1 and a power line to which a power supply voltage VDD is supplied. The load resistor RL2 is coupled between the drain of the NMOS transistor MN2 and the power line to which the power supply voltage VDD is supplied. Further, a first output terminal OUTN is coupled to the drain of the NMOS transistor MN1 through a first output line. A second output terminal OUTP is coupled to the drain of the NMOS transistor MN2 through a second output line.

Next, the buffer circuit 180 will be described. The buffer circuit 180 has NMOS transistors MN31 to MN34 and a current source. The sources of the NMOS transistors MN31 to MN34 are coupled in common to the current source. The gate of the NMOS transistor MN31 is coupled to a power terminal to which the power supply voltage VDD is supplied. The drain of the NMOS transistor MN31 is coupled to the first output line. A negative signal FBN of differential signals provided as the data value outputted from the D latch circuit 161 is provided to the gate of the NMOS transistor MN32. The drain of the NMOS transistor MN32 is coupled to the first output line. A positive signal FBP of the differential signals provided as the data value outputted from the D latch circuit 161 is provided to the gate of the NMOS transistor MN33. The drain of the NMOS transistor MN33 is coupled to the second output line. The gate of the NMOS transistor MN34 is coupled to a ground terminal to which a ground voltage is supplied. The drain of the NMOS transistor MN34 is coupled to the second output line.

The mixer 140 selects whether to pass the current Imain of the current source to the load resistor RL1 or the load resistor RL2 in accordance with the level of the input signal Din, thereby switching the logic level of the output of the mixer 140. Further, the buffer circuit 180 passes the current Iw1 to the load resistor RL1 if the logic level of the fed-back data value is 1, and stops passing the current Iw1 to the load resistors RL1, RL2 if the logic level of the fed-back data value is 0. That is, the buffer circuit 180 provides the offset of w1 or 0 to the signal level of the mixer 140.

In the mixers 144, 154, the positive signal FBP is provided to the gate of the NMOS transistor MN32 shown in FIG. 22, and the negative signal FBN is provided to the gate of the NMOS transistor MN33.

Next, the operation of the decision feedback equalizer 12 according to the third embodiment will be described. The sampling of the data value in the decision feedback equalizer 12 is the same as in the decision feedback equalizer 10 according to the first embodiment; therefore, description thereof is omitted. On the other hand, the sampling of the edge value in the decision feedback equalizer 12 is different from that of the decision feedback equalizer 10 according to the first embodiment in terms of the feedback data value. Hereinafter, the sampling of the edge value in the decision feedback equalizer 12 according to the third embodiment will be described.

FIG. 23 is a table showing the relationship between the pattern of the second and third tap data and the offsets to the edge sampling circuits in the semiconductor device according to the third embodiment. As shown in FIG. 23, in the decision feedback equalizer 12 according to the third embodiment, the offset used for sampling the edge value e(n) is determined based on the data value x(n−2) determined in the second last sampling period and the data value x(n−3) determined in the third last sampling period. More specifically, the relationship between the combination of the data value x(n−3) and the data value x(n−2) and the first edge value ea(n) and the second edge value eb(n) expected for each combination will be described as follows.

More specifically, if the data value x(n−3) is 0 and the data value x(n−2) is 0, the first offset used for sampling the first edge value ea(n) is −w1 and the second offset used for sampling the second edge value eb(n) is +w1. If the data value x(n−3) is 1 and the data value x(n−2) is 0, the first offset used for sampling the first edge value ea(n) is −w1 and the second offset used for sampling the second edge value eb(n) is 0. If the data value x(n−3) is 0 and the data value x(n−2) is 1, the first offset used for sampling the first edge value ea(n) is 0 and the second offset used for sampling the second edge value eb(n) is +w1. If the data value x(n−3) is 1 and the data value x(n−2) is 1, the first offset used for sampling the first edge value ea(n) is −w1 and the second offset used for sampling the second edge value eb(n) is +w1.

As described with reference to FIGS. 11 and 12, in the signal waveform of the input signal Din, the offset used for sampling the edge value needs to be changed in accordance with the levels of the data values in the last and next sampling periods. FIG. 24 is a table showing the relationship between the pattern of data values inputted to the semiconductor device according to the third embodiment and the offsets to the edge sampling circuits.

FIG. 24 shows 16 cases. In cases 1 to 4, the combination of the data value x(n−1) in the last sampling period, the data value x(n) in the current sampling period, and the data value x(n+1) in the next sampling period is 001 in four patterns obtained by the combination of the data value x(n−3) and the data value x(n−2). In cases 5 to 8, the combination of the data value x(n−1) in the last sampling period, the data value x(n) in the current sampling period, and the data value x(n+1) in the next sampling period is 101 in the four patterns obtained by the combination of the data value x(n−3) and the data value x(n−2). In cases 9 to 12, the combination of the data value x(n−1) in the last sampling period, the data value x(n) in the current sampling period, and the data value x(n+1) in the next sampling period is 010 in the four patterns obtained by the combination of the data value x(n−3) and the data value x(n−2). In cases 13 to 16, the combination of the data value x(n−1) in the last sampling period, the data value x(n) in the current sampling period, and the data value x(n+1) in the next sampling period is 110 in the four patterns obtained by the combination of the data value x(n−3) and the data value x(n−2).

First, in cases 1 to 4, since the pattern of the three later-inputted data values is 001, an expected offset value is −w1. On the other hand, based on the data value x(n−3) and the data value x(n−2), the offset is determined to be −w1 in cases 1, 2, 4. That is, by selecting the edge value ea(n) in case 1 where the combination of the data value x(n−3) and the data value x(n−2) is 00, the semiconductor device 1 can acquire the valid edge value e(n). By selecting the edge value ea(n) in case 2 where the combination of the data value x(n−3) and the data value x(n−2) is 10, the semiconductor device 1 can acquire the valid edge value e(n). By selecting the edge value ea(n) in case 4 where the combination of the data value x(n−3) and the data value x(n−2) is 11, the semiconductor device 1 can acquire the valid edge value e(n). On the other hand, in case 3 where the combination of the data value x(n−3) and the data value x(n−2) is 01, since there is no edge sampling circuit for outputting the edge value with the offset of −w1, the semiconductor device 1 cannot acquire the valid edge value e(n)

In cases 5 to 8, since the pattern of the three later-inputted data values is 101, an expected offset value is 0. On the other hand, based on the data value x(n−3) and the data value x(n−2), the offset is determined to be 0 in cases 6, 7. That is, by selecting the edge value eb(n) in case 6 where the combination of the data value x(n−3) and the data value x(n−2) is 10, the semiconductor device 1 can acquire the valid edge value e(n). By selecting the edge value ea(n) in case 7 where the combination of the data value x(n−3) and the data value x(n−2) is 01, the semiconductor device 1 can acquire the valid edge value e(n). On the other hand, in case 5 where the combination of the data value x(n−3) and the data value x(n−2) is 00 and in case 8 where the combination of the data value x(n−3) and the data value x(n−2) is 11, since there is no edge sampling circuit for outputting the edge value with the offset of 0, the semiconductor device 1 cannot acquire the valid edge value e(n).

In cases 9 to 12, since the pattern of the three later-inputted data values is 010, an expected offset value is 0. On the other hand, based on the data value x(n−3) and the data value x(n−2), the offset is determined to be 0 in cases 10, 11. That is, by selecting the edge value eb(n) in case 10 where the combination of the data value x(n−3) and the data value x(n−2) is 10, the semiconductor device 1 can acquire the valid edge value e(n). By selecting the edge value ea(n) in case 11 where the combination of the data value x(n−3) and the data value x(n−2) is 01, the semiconductor device 1 can acquire the valid edge value e(n). On the other hand, in case 9 where the combination of the data value x(n−3) and the data value x(n−2) is 00 and in case 11 where the combination of the data value x(n−3) and the data value x(n−2) is 11, since there is no edge sampling circuit for outputting the edge value with the offset of 0, the semiconductor device 1 cannot acquire the valid edge value e(n).

In cases 13 to 16, since the pattern of the three later-inputted data values is 110, an expected offset value is +w1. On the other hand, based on the data value x(n−3) and the data value x(n−2), the offset is determined to be +w1 in cases 13, 15, 16. That is, by selecting the edge value eb(n) in case 13 where the combination of the data value x(n−3) and the data value x(n−2) is 00, the semiconductor device 1 can acquire the valid edge value e(n). By selecting the edge value eb(n) in case 15 where the combination of the data value x(n−3) and the data value x(n−2) is 01, the semiconductor device 1 can acquire the valid edge value e(n). By selecting the edge value eb(n) in case 16 where the combination of the data value x(n−3) and the data value x(n−2) is 11, the semiconductor device 1 can acquire the valid edge value e(n). On the other hand, in case 14 where the combination of the data value x(n−3) and the data value x(n−2) is 10, since there is no edge sampling circuit for outputting the edge value with the offset of +w1, the semiconductor device 1 cannot acquire the valid edge value e(n).

In the semiconductor device 1 according to the third embodiment as well, the logic circuits of the pattern filter 20 are configured based on the combinations in FIG. 24; however, the description of logical expressions is omitted.

Further, as shown in FIG. 24, in the semiconductor device 1 according to the third embodiment, input data patterns in which the valid edge value cannot be acquired are the same as in the example of the second embodiment shown in FIG. 18. That is, in the semiconductor device 1 according to the third embodiment as well, the valid edge value can be acquired within the temporally close range (e.g., 4 UI) of the invalid edge value as in the second embodiment.

As described above, the decision feedback equalizer 12 according to the third embodiment performs substantially the same operation as the decision feedback equalizer 11 according to the second embodiment. Therefore, as in the decision feedback equalizers according to the first and second embodiments, the decision feedback equalizer 12 according to the third embodiment also can ease the timing restriction on the feedback path and reduce the circuit area and the power consumption.

Further, the valid edge values that can be acquired in the semiconductor device 1 according to the third embodiment are the same as in the second embodiment. Therefore, in the semiconductor device 1 according to the third embodiment as well, it is possible to ensure high phase tracking ability as in the semiconductor device 1 according to the second embodiment.

While the invention made above by the present inventors has been described specifically based on the illustrated embodiments, the present invention is not limited thereto. It is needless to say that various changes and modifications can be made thereto without departing from the spirit and scope of the invention.

For example, in the semiconductor devices according to the above embodiments, the conductivity type (p type or n type) of the semiconductor substrate, the semiconductor layer, the diffusion layer (diffusion region), and the like may be reversed. Therefore, assuming that one of the n type and the p type is a first conductivity type and the other is a second conductivity type, the first conductivity type can be the p type and the second conductivity type can be the n type, or the first conductivity type can be the n type and the second conductivity type can be the p type.

Further, while the above embodiments have been described, clearly expressing the logic levels of signals, the logic levels of signals can also be represented by a first logic level and a second logic level which is the inverse of the first logic level. That is, in the above description, the logic levels for operating the circuits are expressed by way of example, and the logic levels can be inversed and applied.

What is claimed is:
1. A semiconductor device comprising:
a first sampling circuit for outputting a data value and an edge value corresponding to odd-numbered data of data contained in an input signal, using multiphase sampling clocks including a plurality of sampling clocks having different phases by 90 degrees; and a second sampling circuit for outputting a data value and an edge value corresponding to even-numbered data of data contained in the input signal, using the multiphase sampling clocks, wherein one piece of data is sampled in one sampling period, and two sampling periods are included in one cycle of the sampling clock, the first sampling circuit and the second sampling circuit each comprising:

a first data sampling circuit which adds a negative offset to a signal level of the input signal, samples the input signal, and outputs a first data value;

a second data sampling circuit which adds a positive offset to the signal level of the input signal, samples the input signal, and outputs a second data value;

a selector for selecting and outputting the first data value or the second data value as the data value, based on a data value sampled in a last sampling period;

a shift register for shifting and outputting the data value outputted by the selector to a subsequent register in order;

a first edge sampling circuit which adds a first offset to the signal level of the input signal and outputs a first edge value indicating a value of an edge part of the input signal; and a second edge sampling circuit which adds a second offset to the signal level of the input signal and outputs a second edge value indicating a value of an edge part of the input signal, wherein at least one of the first offset and the second offset in one sampling circuit is determined based on a data value acquired from a location other than between the selector and the shift register in the other sampling circuit.

2. The semiconductor device according to claim 1, wherein the first offset in the one sampling circuit in a current sampling period is determined based on the first data value outputted in the last sampling period.

3. The semiconductor device according to claim 2,
wherein the first data sampling circuit of the other sampling circuit comprises
a first sampler which outputs a data value corresponding to a logic level of data contained in the input signal, and
a first latch circuit which latches the output of the first sampler, using one of the multiphase sampling clocks, and outputs the latched data as the first data value,
wherein the first offset in the one sampling circuit is determined based on the data value outputted from the first sampler, and
wherein the second offset in the one sampling circuit is provided as a preset fixed value.

4. The semiconductor device according to claim 1,
wherein the first offset in the one sampling circuit in the current sampling period is determined based on a data value sampled in a second last sampling period and a data value sampled in a third last sampling period, and
wherein the second offset in the one sampling circuit in the current sampling period is determined based on the data value sampled in the third last sampling period.

5. The semiconductor device according to claim 4,
wherein the shift register comprises a first D latch circuit for latching the data value outputted from the selector and a second D latch circuit coupled subsequently to the first D latch circuit at least,
wherein the first offset in the one sampling circuit is determined based on an output value of the first D latch circuit of the shift register in the one sampling circuit and an output-value of the second D latch circuit of the shift register in the other sampling circuit, and
wherein the second offset in the one sampling circuit is determined based on the output value of the second D latch circuit of the shift register in the other sampling circuit.

6. The semiconductor device according to claim 1, wherein the first offset and the second offset in the one sampling circuit in the current sampling period are determined based on a data value sampled in a second last sampling period and a data value sampled in a third last sampling period.

7. The semiconductor device according to claim 6,
wherein the shift register comprises, at least, a first D latch circuit for latching the data value outputted from the selector and a second D latch circuit coupled subsequently to the first D latch circuit at least,
wherein the first offset and the second offset in the one sampling circuit are determined based on an output value of the first D latch circuit of the shift register in the one sampling circuit and an output value of the second D latch circuit of the shift register in the other sampling circuit.

8. The semiconductor device according to claim 1, comprising:
a sampling circuit which comprises the first sampling circuit and the second sampling circuit and outputs the data value and the edge value including the first edge value and the second edge value;
a pattern filter which determines validity or invalidity of the edge value, based on a temporal change of the data value;
a phase detection circuit which determines a phase difference between one of the multiphase sampling clocks and the input signal, based on the edge value determined to be valid by the pattern filter and the data value;
a phase control circuit which outputs a phase control signal for controlling phases of the multiphase sampling clocks, in accordance with a determination result of the phase detection circuit; and
a phase shift unit which generates multiphase clocks from a reference clock and outputs, as the multiphase sampling clocks, the multiphase clocks selected from the multiphase clocks based on the phase control signal.

9. The semiconductor device according to claim 8, wherein based on logic levels of data values outputted from the sampling circuit in successive sampling periods, the pattern filter selects and outputs one of the first edge value and the second edge value included in the edge value, and outputs a flag value indicating validity of the selected edge value.

* * * * *